(12) United States Patent
Bahamonde et al.

(10) Patent No.: US 11,973,490 B2
(45) Date of Patent: Apr. 30, 2024

(54) NON-RECIPROCAL FILTER

(71) Applicant: The Trustees of Columbia University in the City of New York, New York, NY (US)

(72) Inventors: Jose Antonio Bahamonde, New York, NY (US); Ioannis Kymissis, New York, NY (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 343 days.

(21) Appl. No.: 17/150,579

(22) Filed: Jan. 15, 2021

(65) Prior Publication Data
US 2021/0226609 A1    Jul. 22, 2021

Related U.S. Application Data

(60) Provisional application No. 62/962,378, filed on Jan. 17, 2020.

(51) Int. Cl.
| H03H 9/64 | (2006.01) |
| H03F 7/00 | (2006.01) |
| H03H 9/02 | (2006.01) |
| H03H 9/145 | (2006.01) |
| H03H 11/04 | (2006.01) |

(52) U.S. Cl.
CPC .......... *H03H 9/64* (2013.01); *H03F 7/00* (2013.01); *H03H 9/02559* (2013.01); *H03H 9/145* (2013.01); *H03H 9/14505* (2013.01); *H03H 11/04* (2013.01)

(58) Field of Classification Search
CPC ...... H03H 9/64; H03H 9/02559; H03H 9/145; H03H 9/14505; H03H 11/04; H03H 3/08; H03H 7/52; H01P 1/32; H01P 1/36; H01P 1/38; H03F 7/00; H03F 7/02; H03F 7/04
See application file for complete search history.

(56) References Cited

U.S. PATENT DOCUMENTS

| 6,771,415 B2 | 8/2004 | Endo et al. |
| 7,414,779 B2 | 8/2008 | Huber et al. |
| 9,445,785 B2 | 9/2016 | Clingman et al. |

(Continued)

OTHER PUBLICATIONS

Bahamonde, et al., "Acoustoelectric Amplification of Surface Acoustic Waves on ZnO deposited on AlGaN/GaN Epi", https://par.nsf.gov/servlets/purl/10047265, IEEE 75th Annual Device Research Conference, South Bend, Indiana, <https://ieeexplore.ieee.org/abstract/document/7999456>, Aug. 3, 2017 (2 pages).

(Continued)

*Primary Examiner* — John W Poos
(74) *Attorney, Agent, or Firm* — Wilmer Cutler Pickering Hale and Dorr LLP

(57) ABSTRACT

A non-reciprocal filter with parametric amplification to obtain non-reciprocal propagation of forward and reverse signals is disclosed. The non-reciprocal filter may include two asymmetrical transmission lines and a current source. The filter, when implemented in the acoustics domain using surface acoustic waves (SAW), may operate in a phase-coherent or a phase-incoherent degenerate mode, providing low insertion loss and high decibels of isolation.

16 Claims, 27 Drawing Sheets

(56) References Cited

U.S. PATENT DOCUMENTS

| | | | |
|---|---|---|---|
| 9,517,055 | B2 | 12/2016 | Zalev |
| 2016/0209594 | A1 | 7/2016 | Bahl |
| 2018/0041188 | A1* | 2/2018 | Shoda ............... H03F 1/26 |
| 2018/0241375 | A1* | 8/2018 | Oya ............... H03H 7/253 |

OTHER PUBLICATIONS

Devaux, et al., "Acoustic radiation pressure for nonreciprocal transmission and switch effects", https://doi.org/10.1038/s41467-019-11305-7, Nature Communications, 10:Article 3292, Jul. 23, 2019 (8 pages).

Dinc, et al., "17.2: A 28GHz Magnetic-Free Non-Reciprocal Passive CMOS Circulator Based on Spatio-Temporal Conductance Modulation", https://ieeexplore.ieee.org/abstract/document/7870377, IEEE International Solid-State Circuits Conference, San Francisco, California, Feb. 5-9, 2017, pp. 294-295 (3 pages).

Dinc, et al., "A Millimeter-Wave Non-Magnetic Passive SOI CMOS Circulator Based on Spatio-Temporal Conductivity Modulation", https://ieeexplore.ieee.org/abstract/document/8100704, IEEE Journal of Solid State Circuits, 52(12): 3276-3292, Dec. 2017 (17 pages).

Dinc, et al., "Millimeter-wave Full-Duplex Wireless: Applications, Antenna Interfaces and Systems", <https://ieeexplore.ieee.org/abstract/document/7993663>, IEEE Custom Integrated Circuits Conference, Austin, Texas, Apr. 30-May 3, 2017 (8 pages).

Dinc, et al., "Synchronized conductivity modulation to realize broadband lossless magnetic-free non-reciprocity", doi.10.1038/s41467-017-00798-9, https://www.nature.com/articles/s41467-017-00798-9, Nature Communications, 8:795, Oct. 2017 (9 pages).

Ghatge, et al., "A Non-Reciprocal Filter Using Asymmetrically Transduced Micro-Acoustic Resonators", doi:10.1109/LED.2019.2907089, IEEE Electron Device Letters, 40(5):800-803, published Mar. 22, 2019 (4 pages).

Gu, et al., "Broadband non-reciprocal transmission of sound with invariant frequency", doi:10.1038/srep19824, https://www.nature.com/articles/srep19824, Scientific Reports, 6:19824, Jan. 25, 2016 (6 pages).

Hua, et al., "Demonstration of a chip-based optical isolator with parametric amplification", https://www.nature.com/articles/ncomms13657, Nature Communications, 7:13657, Nov. 25, 2016 (6 pages).

Krishnaswamy, Principal Investigator, "Award Abstract #1641100: EFRI NewLAW: Novel Approaches to RF Non-Reciprocity in Semiconductor Systems", National Science Foundation, EFMA Emerging Frontiers & Multidisciplinary Activities, Start date Sep. 1, 2016, <https://www.nsf.gov/awardsearch/showAward?AWD_ID=1641100&HistoricalAwards=false>, accessed May 16, 2023 (6 pages).

Lu, et al., "A Radio Frequency Non-Reciprocal Network Based on Switched Low-Loss Acoustic Delay Lines", https://ieeexplore.ieee.org/document/8579758, IEEE International Ultrasonics Symposium (IUS), Kobe, Japan, Oct. 22-25, 2018 (4 pages).

Luo, et al., "Non-reciprocal wave propagation in one-dimensional nonlinear periodic structures", https://aip.scitation.org/doi/full/10.1063/1.5010990, AIP Advances, 8:015113, Jan. 10, 2018 (12 pages).

Nagulu, et al., "Nonreciprocal Components Based on Switched Transmission Lines", https://ieeexplore.ieee.org/abstract/document/8435969, IEEE Transactions on Microwave Theory and Techniques, 66(11):4706-4725, Nov. 2018 (20 pages).

Pirro, et al., "Novel topology for a non-reciprocal MEMS filter", doi:10.1109/ULTSYM.2018.8580092, IEEE International Ultrasonics Symposium (IUS), Kobe, Japan, Oct. 22-25, 2018, (4 pages).

Tapen, et al., "The Impact of LO Phase Noise in N-Path Filters", doi:10.1109/TCSI.2017.2761260, https://ieeexplore.ieee.org/abstract/document/8077764, IEEE Transactions on Circuits and Systems I: Regular Papers, 65(5):1481-1494, published Oct. 20, 2017 (14 pages).

Wang, Principal Investigator, "Award Abstract #1641128, EFRI NewLAW: Non-Reciprocal, Parametric Amplification of Acoustic Waves for Future Generation of RF Front-Ends", National Science Foundation, EFMA Emerging Frontiers & Multidisciplinary Activities, Start date Sep. 1, 2016, <https://www.nsf.gov/awardsearch/showAward?AWD_ID=1641128>, accessed May 16, 2023 (7 pages).

* cited by examiner

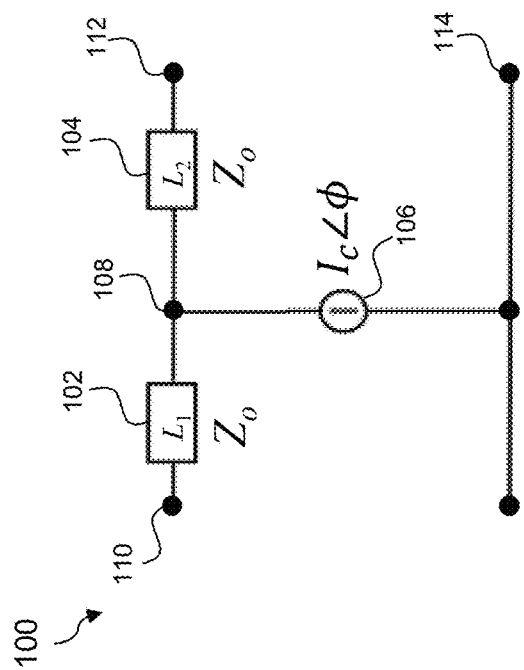
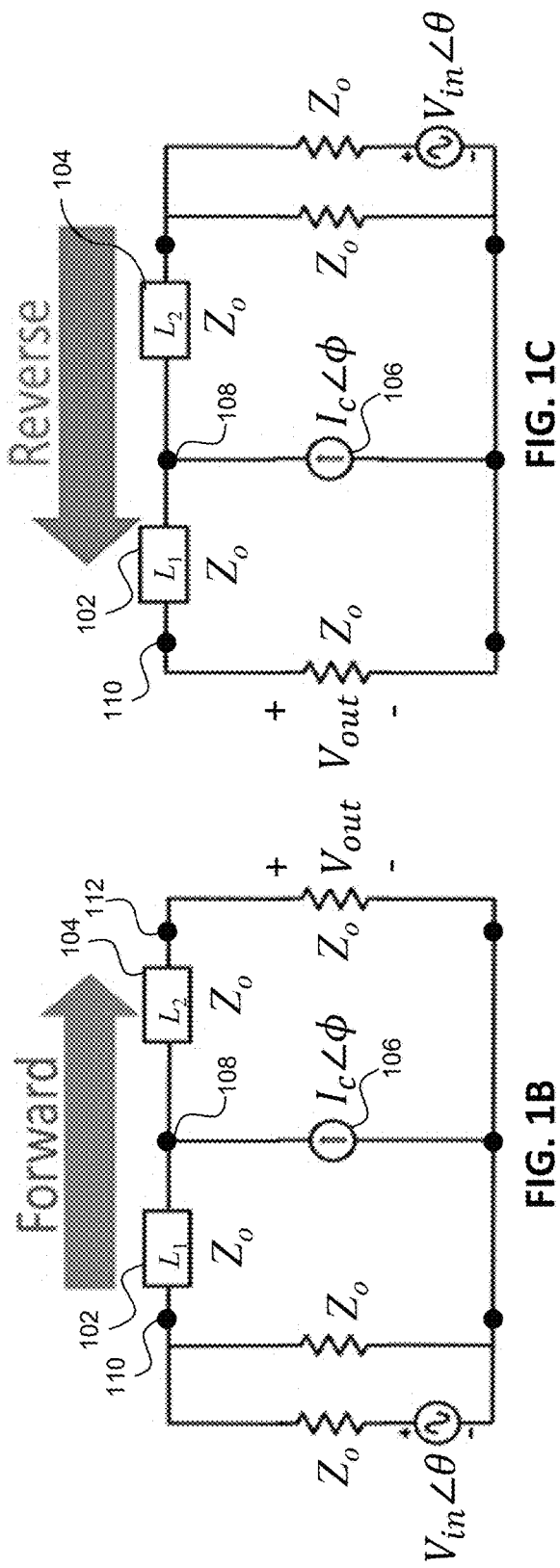
FIG. 1A
FIG. 1B
FIG. 1C

NON-RECIPROCAL FILTER

CROSS-REFERENCE TO RELATED APPLICATION

This application claims the benefit of priority to U.S. Provisional Application No. 62/962,378, entitled "Non-Reciprocal Filter," filed on Jan. 17, 2020, the disclosure of which is hereby incorporated by reference in its entirety.

STATEMENT OF GOVERNMENTAL INTEREST

This invention was made with government support under Grant No. 1641100 awarded by the National Science Foundation (NSF) Emerging Frontiers in Innovation and Research (EFRI) program. The government has certain rights in the invention.

TECHNICAL FIELD

The invention relates to filters, and more particularly to non-reciprocal filters.

COPYRIGHT NOTICE

This disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

BACKGROUND OF THE DISCLOSURE

Filters are used in various signal processing applications, such as wireless communication (e.g., cellular and Wi-Fi), magnetic resonance imaging (MRI), etc. In wireless communication, for example, filters are essential elements in carrier aggregation (CA), which enhances data capacity by combining, into one channel, two or more carriers that have distinct frequency bands. To disaggregate information transmitted in each frequency band, a cellular device (e.g., a smartphone) typically includes several filters, each tuned to one of the bands. If there are eight frequency bands, the cellular device includes eight filters. Moreover, to maintain signal integrity of the different carriers (e.g., to prevent one filter from injecting noise into another), the cellular device also includes switches to isolate the filters from one another. Consequently, filters and switches undesirably add to the size and weight of the cellular device.

Non-reciprocal filters can provide their own isolation without needing switches. A non-reciprocal component transmits a signal asymmetrically between two ports. For example, it can transmit a signal in one direction, while blocking the same signal in the opposite direction. Non-reciprocal components are typically characterized by their insertion loss and isolation capabilities. Insertion loss (or negative gain), expressed in decibels (dB), represents the loss in power of a signal when the signal is transmitted from one port to another. Isolation, also expressed in dB, is the capability of preventing a signal applied at one port from reaching another port. Accordingly, for example, it is desirable for non-reciprocal filters, which are used for CA, to have low insertion loss and relatively high decibels of isolation. Non-reciprocal filters enable new paradigms, such as full-duplex wireless, that are otherwise not feasible and promise to significantly enhance wireless data capacity.

Conventional non-reciprocal components are typically realized through magneto-optic Faraday effect, requiring the use of ferrite materials that are expensive, bulky, and incompatible with the silicon-based integrated circuit technologies that power the wireless and computing revolutions. In recent years, the development of magnetic-free techniques for creating non-reciprocal devices have generated significant interest in the communications community due to the high impact that such devices may have in modern systems. Researchers have adapted some of these techniques to acoustic devices to combine nonreciprocal acoustic propagation with signal processing. Such devices may greatly enhance the efficiency of front-end circuits for wireless communication systems (e.g., cellular and Wi-Fi), allowing, for example, full duplex use of antennas, and also leading the way to new architectures for next generation communication technologies.

Typical methods for creating non-reciprocity without the use of magnetics involves spatial-temporal modulation, which requires the use of two or more clock signals with very precise phase relationships. For example, six clock signals along with an equal number of film bulk acoustic resonators (FBARs) have been used to demonstrate a non-reciprocal filter with −5.6 dB of insertion loss and 15 dB of isolation. See M. Pirro et al., "Novel Topology for a Non-Reciprocal MEMS Filter," *IEEE International Ultrasonics Symposium (IUS)*, vol. 2018-October, pp. 1-3, 2018 (hereinafter "Pirro"). An exemplary non-reciprocal network uses four modulation signals and exhibits −6.6 dB of insertion loss and over 25 dB of isolation. See R. Lu et al., "A Radio Frequency Non-Reciprocal Network Based on Switched Low-Loss Acoustic Delay Lines," 2018 *IEEE International Ultrasonics Symposium (IUS)*, Kobe, 2018, pp. 1-4 (hereinafter "Lu").

In these typical methods, a local oscillator (LO) is required for every clock signal or modulation signal. Thus, as the number of signals increases, the number of LOs also increases and so do the size and cost of the non-reciprocal device. Moreover, it may be problematic to achieve and maintain precise phase relationships among the signals, mainly as physical components age over time. Accordingly, there is a need for non-magnetic non-reciprocal devices that require a reduced number of clock signals, without synchronization.

SUMMARY

Systems and methods are disclosed for filtering circuitry. In some embodiments, a filter includes a first port and a second port, wherein an input signal propagates from the first port to the second port; a third port different from the first and second ports; a first transmission line connected to the first port and the third port; a second transmission line connected to the second port and the third port; and a current source connected to the third port, wherein the current source provides a modulation signal to the third port.

In some embodiments, the length of the first transmission line is different from the length of the second transmission line. In some embodiments, the length of the first transmission line is offset by $\lambda/2$ from the length of the second transmission line is $\lambda$, wherein $\lambda$ represents an angular wavelength of the input signal propagating from the first port to the second port.

In some embodiments, the phase of the current source matches the phase of the input signal. In some embodiments, the phase of the current source is different from the phase of the input signal.

In some embodiments, the first and second transmission lines each includes at least one capacitor and at least one inductor.

In some embodiments, the current source includes a parametric amplifier. In some embodiments, the parametric amplifier includes a pump circuit and a varactor. In some embodiments, the varactor includes an abrupt varactor diode.

In some embodiments, the filter provides a positive forward gain. In some embodiments, the filter provides a negative reverse gain.

In some embodiments, the filter includes a surface acoustic wave (SAW) structure, and wherein the SAW structure includes an input transducer, an output transducer, and a center transducer. In some embodiments, the input and output transducers each includes a single-phase uni-directional interdigital transducer. In some embodiments, the center transducer includes a bi-directional interdigital transducer. In some embodiments, the center transducer includes a unidirectional interdigital transducer. In some embodiments, the distance between the input transducer and the center transducer is offset by $\lambda/2$ from the distance between the center transducer and the output transducer. In some embodiments, the SAW structure includes a lithium niobate ($LiNbO_3$) substrate. In some embodiments, the SAW structure includes chrome and gold.

BRIEF DESCRIPTION OF THE FIGURES

For a more complete understanding of various embodiments of the disclosed subject matter, reference is now made to the following descriptions taken in connection with the accompanying drawings, in which:

FIG. 1A illustrates a three-port topology of a non-reciprocal filter, according to some embodiments of the present disclosure; FIGS. 1B and 1C illustrate exemplary circuits with a non-reciprocal filter, according to some embodiments of the present disclosure;

DETAILED DESCRIPTION

Figure 2:
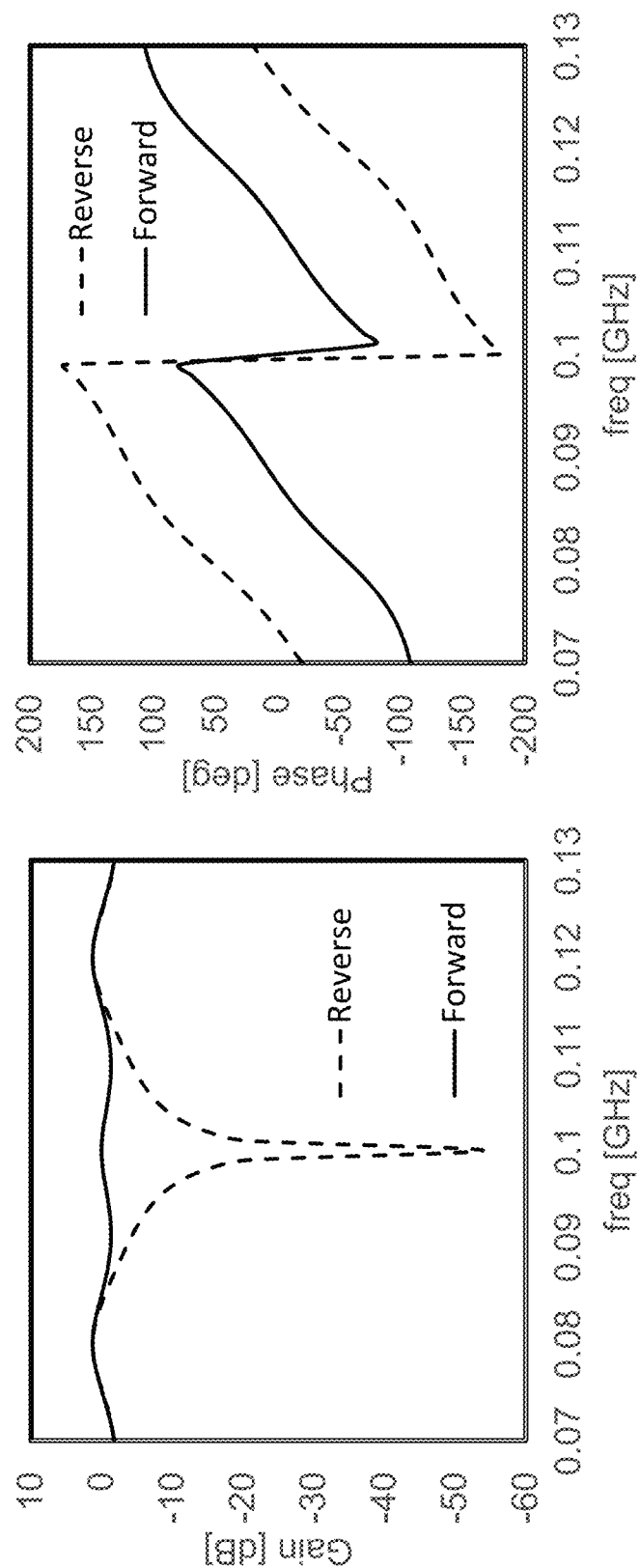
FIG. 2 shows frequency responses of a non-reciprocal filter, according to some embodiments of the present disclosure.

The present disclosure will now be described in more detail with reference to particular embodiments thereof as shown in the accompanying drawings. While the present disclosure is described below with reference to particular embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

Embodiments of the present disclosure relate to non-reciprocal filters with a single modulation signal. The non-reciprocal filters can provide relatively low insertion loss and high isolation. In some embodiments, the non-reciprocal filters may have tunable frequency characteristics. The tunability obviates the need to have multiple filters for different frequencies in a system. In yet other embodiments, the non-reciprocal filters may be implemented in the acoustics domain without the use of magnetics, thereby significantly reducing the size of the filters.

FIG. 1A illustrates a three-port topology of a non-reciprocal filter 100, according to some embodiments of the present disclosure. The non-reciprocal filter includes transmission lines 102 and 104, respectively having lengths $L_1$ and $L_2$. Transmission lines are also known as delay lines. Transmission lines 102 and 104 each has one end coupled to a current source 106, which is connected across Port 108 and node common 114 to Ports 110 and 112, as shown in FIG. 1A. The current source 106 has a magnitude $I_C$ and a phase $\phi$, and provides a modulation signal to transmission lines 102 and 104. The non-reciprocal filter may transmit a signal from Port 110 to Port 112, while attenuating a signal from Port 112 to Port 110, or vice versa. For non-reciprocity, transmission lines 102 and 104 may be asymmetrical (i.e., of different lengths; $L_1 \neq L_2$). For example, $L_1 = \lambda/2$ and $L_2 = \lambda$, where $\lambda$ represents an angular wavelength of a signal propagating through transmission lines 1 and 2. Asymmetry of the transmission lines may allow introduction of desirable frequency characteristics and by controlling the asymmetry, the filter can be tuned for a particular frequency response.

In some embodiments, the filter may operate in two modes—a phase-coherent mode and phase-incoherent mode. To operate in the phase-coherent mode, the phase of an input signal (e.g., a signal applied at Port 110) must be known such that the phase $\phi$ of the current source 106 $I_C$ is tuned to match it. In the phase-incoherent mode, the phase of the input signal is unknown and tuning the phase $\phi$ of the current source 106 changes the phase relationship between in the input signal and the current source 106, thereby changing the frequency response of the filter. If $L_1 = \lambda/2$ and $L_2 = \lambda$, a 180° phase difference is maintained between forward and reverse signals (i.e., signals transmitted from Port 110 to Port 112 and vice versa).

The insertion loss and isolation of the filter may be analyzed by looking at the forward scattering parameter (S-parameter) $S_{21}$ and the reverse S-parameter Sit while applying a input test signal $V_{in}$ with a phase $\theta$ across Port 110 and Port 112, respectively, as shown in FIGS. 1B and 1C. The insertion loss and isolation may be expressed in terms of the S-parameters $S_{21}$ and $S_{12}$ as follows:

$$\text{insertion loss} = 20 \log_{10} |S_{21}| \text{ dB} \quad (1)$$

$$\text{isolation} = 20 \log_{10} |S_{12}| \text{ dB} \quad (2)$$

The S-parameters $S_{21}$ and $S_{12}$ may be derived and expressed as follows:

$$S_{21} = \frac{-2\left(2V_{in}e^{-j\theta} - Z_o I_C e^{-j(\phi + \beta L_1)} + 3Z_0 I_C e^{j(\beta L_2 - \phi)}\right)}{V_{in}e^{-j\theta}\left(e^{-j\beta(L_1 + L_2)} - 9e^{j\beta(L_1 + L_2)}\right)} \quad (3)$$

$$S_{12} = \frac{-2\left(2V_{in}e^{-j\theta} - Z_o I_C e^{-j(\phi + \beta L_2)} + 3Z_0 I_C e^{j(\beta L_1 - \phi)}\right)}{V_{in}e^{-j\theta}\left(e^{-j\beta(L_1 + L_2)} - 9e^{j\beta(L_1 + L_2)}\right)} \quad (4)$$

If $L_1 = \lambda/2$ and $L_2 = \lambda$, and the filter is operating in the phase-coherent mode (i.e., the input test signal $V_{in}$ and the current source $I_C$ are in phase; i.e., $\theta - \phi = 0°$; e.g., $\theta = \phi = 0°$), equations 3 and 4 may be simplified as follows:

$$S_{21} = \frac{-2(2V_{in} + 4Z_0 I_C)}{4V_{in}} \quad (5)$$

$$S_{12} = \frac{-2(2V_{in} - 4Z_0 I_C)}{4V_{in}} \quad (6)$$

As can be observed from equations 5 and 6, the contribution of the current source $I_C$ is either added to the input test signal in the forward direction or subtracted from the input signal in the reverse direction. Further, in some embodiments, if the magnitude of the current source is such that the magnitude of the second term is close to or matches the magnitude of the input signal (e.g., $V_{in} = 4Z_0 I_C$), the frequency response may become that of an isolator as depicted in FIG. 2, for example. FIG. 2 shows frequency responses of a non-reciprocal filter, according to some embodiments of the present disclosure. FIG. 2 shows that there is low insertion loss in the forward transmission, but a substantial cancellation of transmission (i.e., isolation) in the reverse direction. The frequency at which the isolation occurs is the frequency at which the electrical lengths of the transmission lines are 180° for $L_1$ and 360° for $L_2$.

Figure 3:
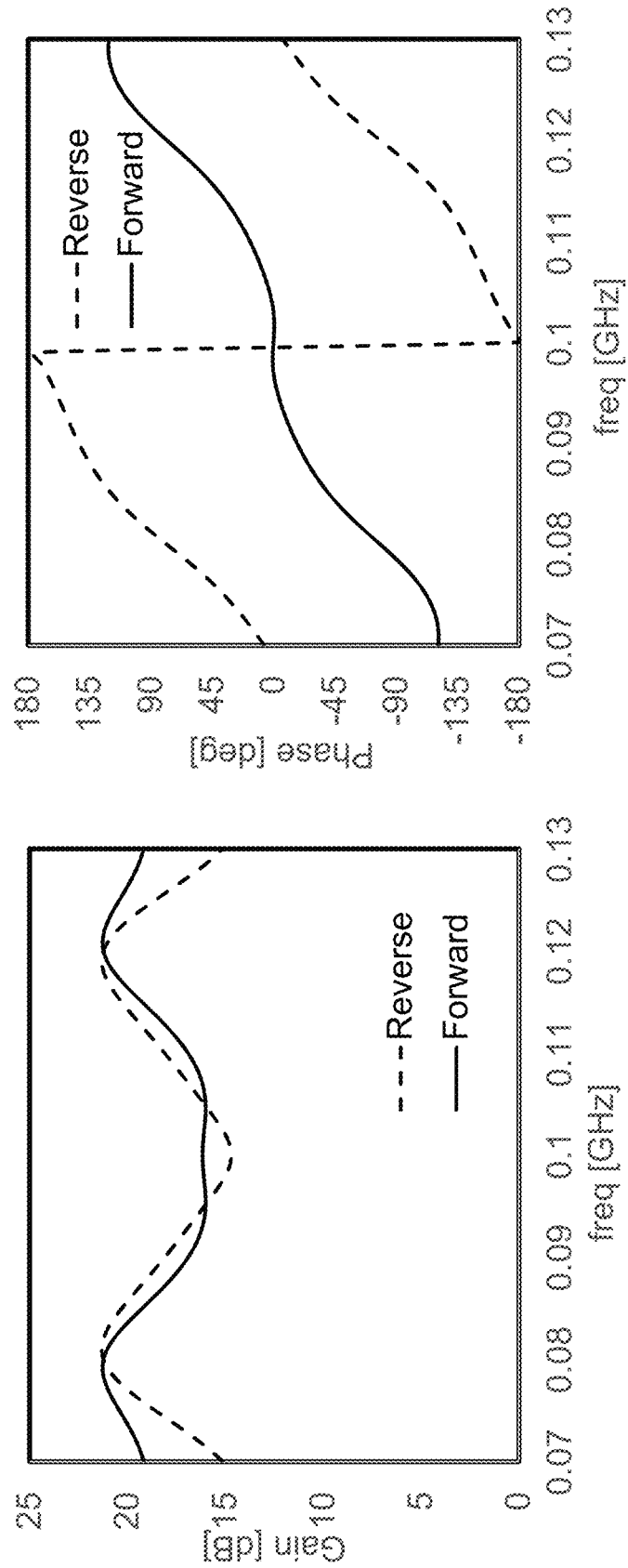
FIG. 3 shows frequency responses of a non-reciprocal filter, according to some embodiments of the present disclosure.

In some embodiments, when the magnitude of the current source is such that $V_{in} << 4Z_0 I_C$, the contribution from the second term, in equations 5 and 6, may dominate the numerator. This may result in the frequency response illustrated in FIG. 3—while there exists some non-reciprocity in magnitude between forward and reverse signals, it may be weak. However, at the center frequency, due to the same flip in sign caused by the asymmetry of the transmission lines lengths, there is a 180° difference between forward and reverse transmitted signals. This behavior may be similar to that of a gyrator. Therefore, both regions of operation (i.e., $V_{in} = 4Z_0 I_C$ and $V_{in} << 4Z_0 I_C$) demonstrate useful nonreciprocal behavior that may be leveraged to create isolators and circulators.

Figure 4:
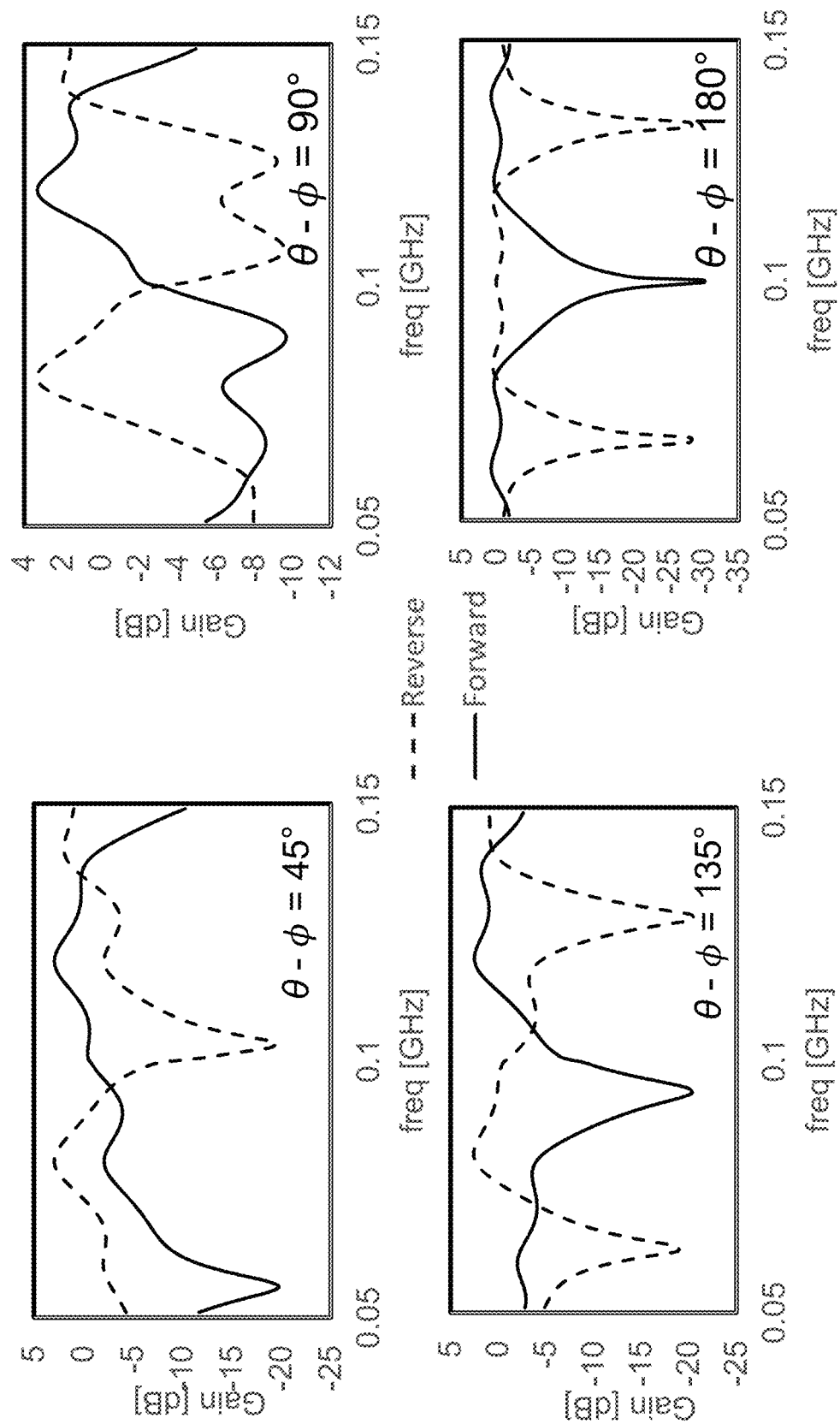
FIG. 4 shows frequency responses of a non-reciprocal filter in the phase-incoherent mode, according to some embodiments of the present disclosure.

FIG. 4 illustrates frequency responses of the filter operating in the phase-incoherent mode (i.e., $\theta \neq \phi$), according to some embodiments of the present disclosure. Namely, FIG. 4 shows responses when the phase difference between the current source and input signal is 45°, 90°, 135°, and 180°. As can be seen, the frequency response of the filter may be tuned by tuning the phase of the current source.

Figure 5:
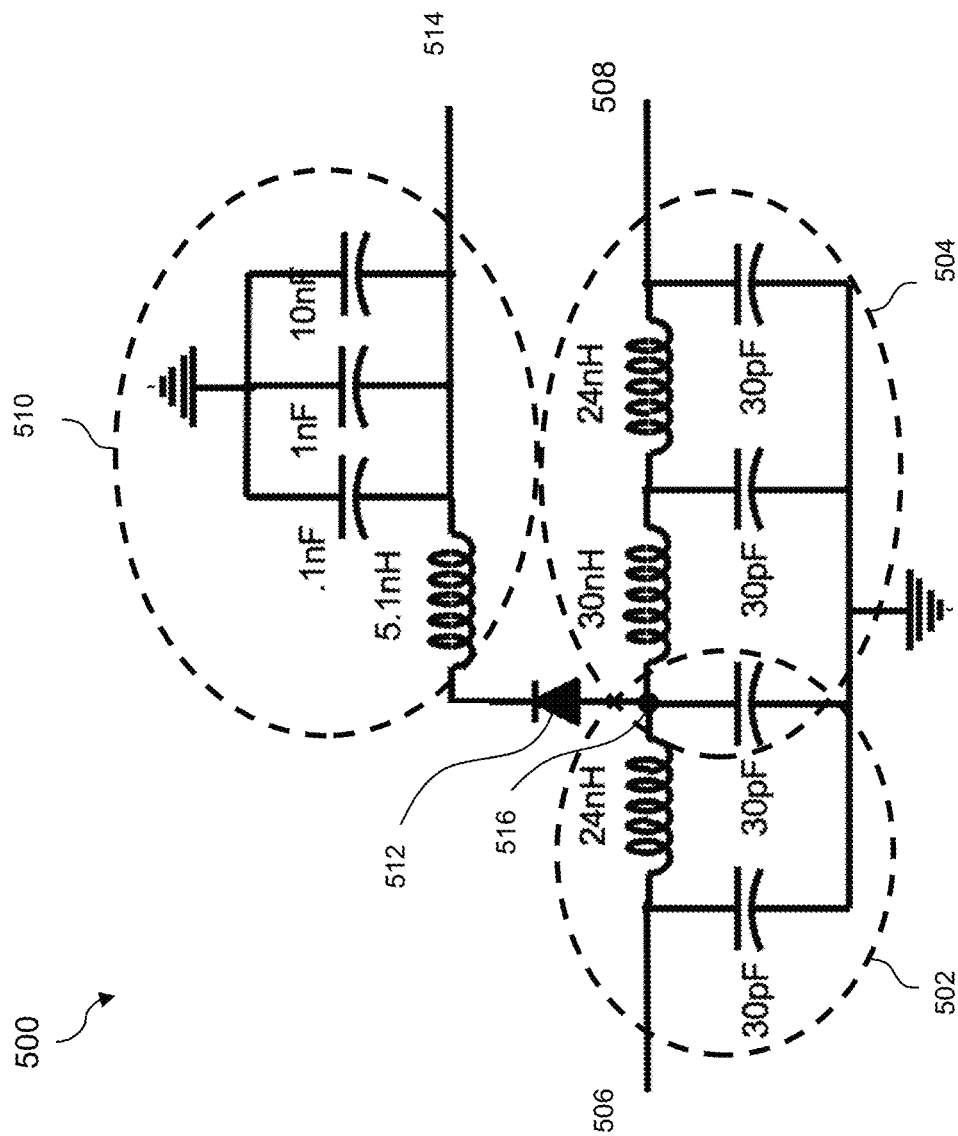
FIG. 5 shows a schematic of an implementation of a non-reciprocal filter, according to some embodiments of the present disclosure.

FIG. 5 shows a schematic of an exemplary implementation 500 of the filter 100 in FIG. 1, according to some embodiments of the present disclosure. As can be seen, asymmetrical transmission lines 502 and 504 are implemented via interconnections of capacitors and inductors. Transmission lines 502 and 504 are connected to Port 506 and Port 508 respectively and may be modulated using different techniques. In some embodiments, some of the modulation techniques may include: (1) commutation (i.e., turning on or off), (2) adding phase (i.e., delaying the signal), (3) fixing one branch but modulating the other branch, (4) adding gains, (5) adding adjustable non-linear elements (e.g., those that would provide optical/electrical/mechanical stimulation to generate different frequency response), and/or (6) adding parametric amplifiers as the recombiners. For example, as shown in FIG. 5, a pump circuit 510 and a varactor 512 serve may as a phase-coherent parametric amplifier that can convert a pump signal 514 into a modulation signal at Port 516.

Figure 6:
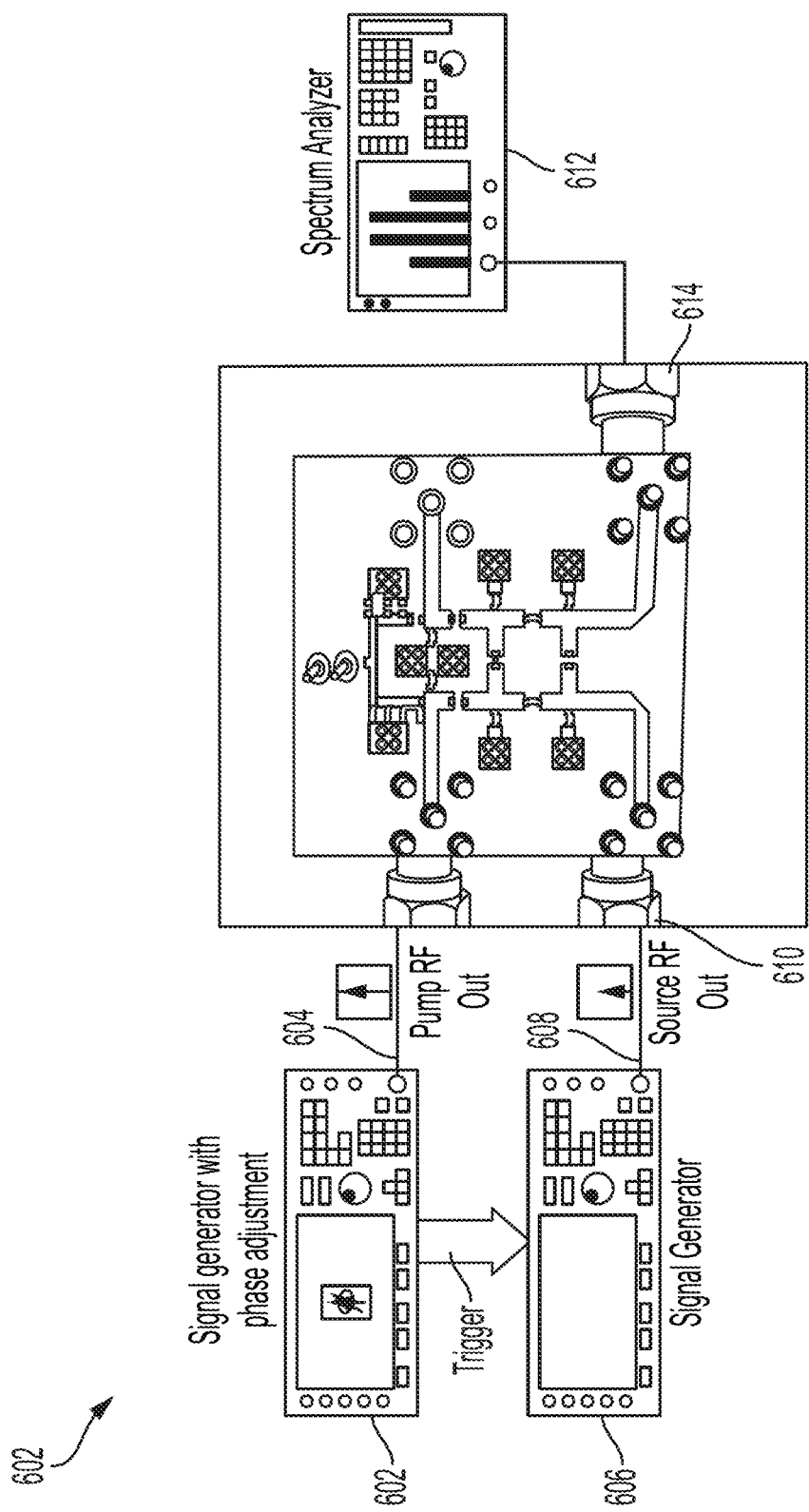
FIG. 6 illustrates a test setup of a non-reciprocal filter, according to some embodiments of the present disclosure.

FIG. 6 illustrates a test setup 600 of the filter 500 of FIG. 5, the filter being built on a printed circuit board (PCB), according to some embodiments of the present disclosure. A first signal generator 602 provides a pump signal 604 to the pump circuit. A second signal generator 606, triggered by the first signal generator 602 to provide phase coherence, provides an input signal 608 at Port 610. In some embodiments, the signal generator 602 and the signal generator 606 are synchronized via a 10 MHz reference signal. A spectrum analyzer 612 is couple to Port 614 to record for the forward response of the filter. For the reverse response, the second signal generator 606 can be coupled to Port 614 and the spectrum analyzer coupled to Port 614.

Figure 7:
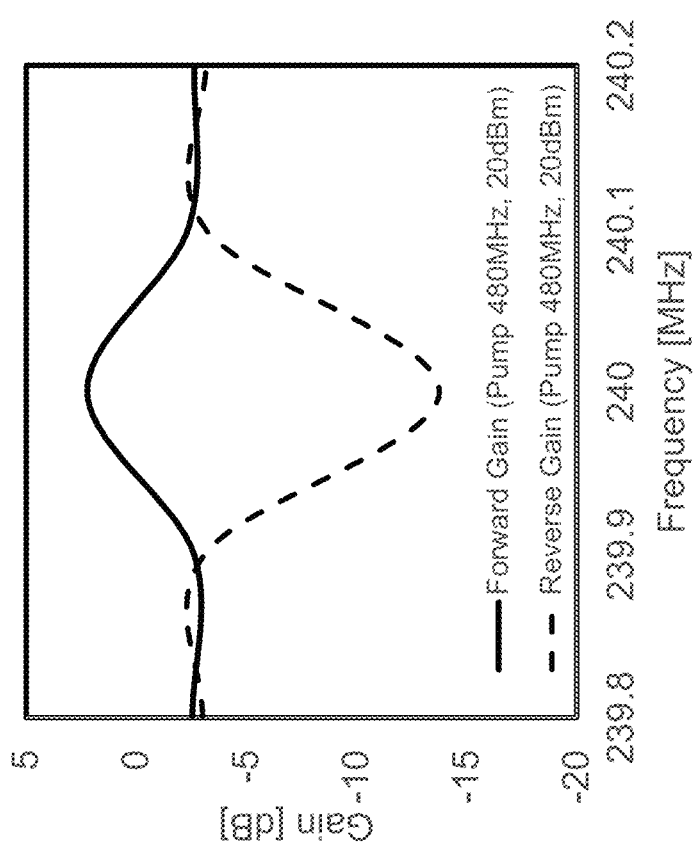
FIG. 7 shows forward and reverse frequency responses of a non-reciprocal filter, according to some embodiments of the present disclosure.

FIG. 7 shows the forward and reverse frequency responses of the test setup 600 of FIG. 6, according to some embodiments of the present disclosure. As can be seen, the filter is capable of providing gain in the forward direction, thereby improving signal strength. The filter can also provide isolation (i.e., attenuation of signal) in the reverse direction.

Figure 8:
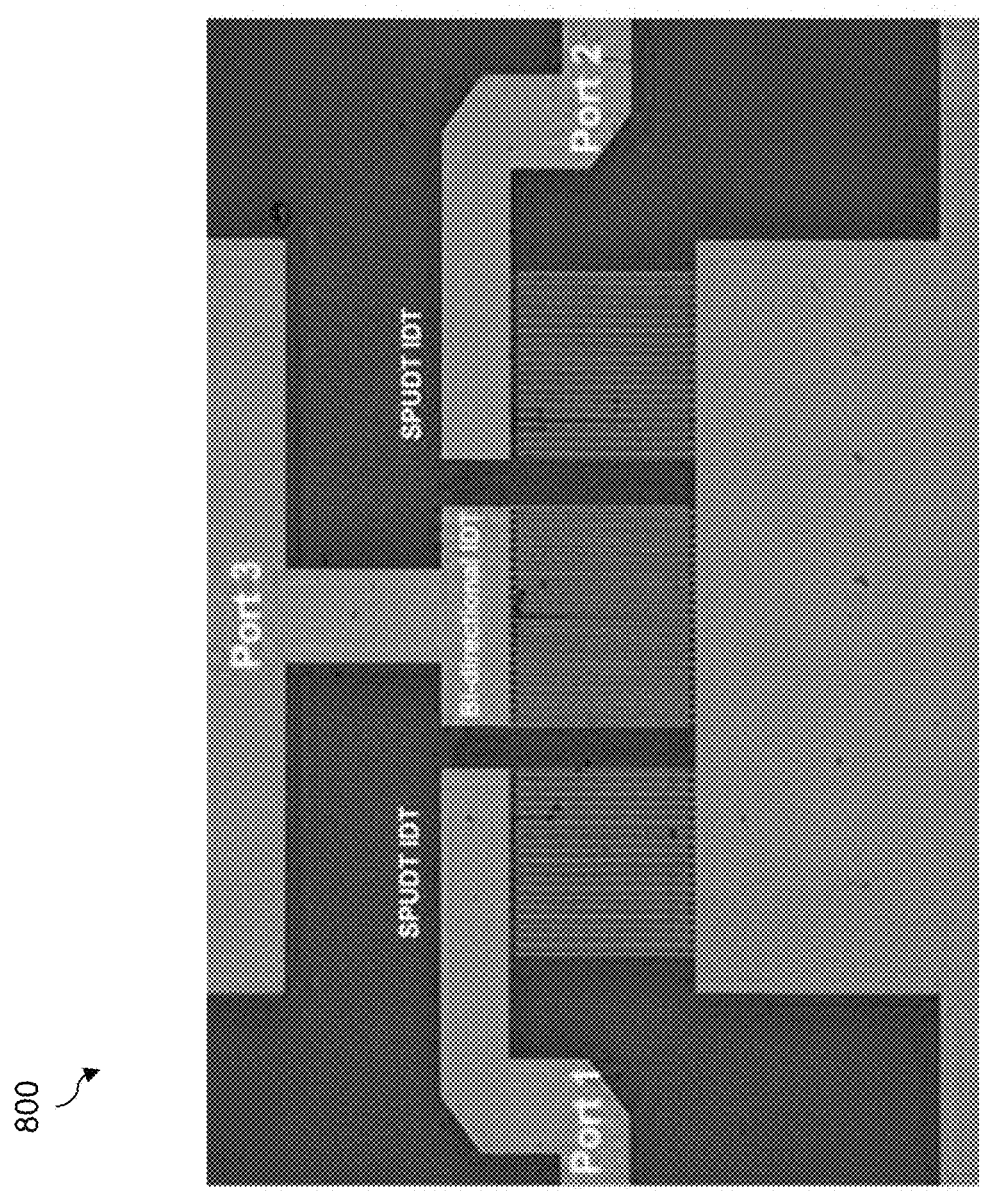
FIG. 8 illustrates a micrograph of an implementation of a non-reciprocal filter in an acoustics domain as a surface acoustic wave (SAW) structure, according to some embodiments of the present disclosure.

FIG. 8 illustrates a micrograph of an exemplary implementation 800 of the filter 100 of FIG. 1 in the acoustics domain as a surface acoustic wave (SAW) structure, according to some embodiments of the present disclosure. In some embodiments, transmission lines 102 and 104 are implemented as SAW delay lines. As can be seen in FIG. 8, the input and output transducers of the SAW structure are designed as single-phase uni-directional interdigital transducers (SPUDT) and the center transducer as bi-directional interdigital transducer (IDT). The center transducer may be coupled to a parametric circuit providing a modulation signal. In some embodiments, the SAW structure may be manufactured for a desired wavelength and center frequency. For example, the embodiment of FIG. 8, the phase velocity of the SAW was set at 3780 meters per second (m/s). For such a phase velocity, a wavelength of 20 micrometer (μall) is chosen for a center frequency of 189 megahertz (MHz). Thus, the minimum electrode width is 2.5 μm. The transducer width is 18$\lambda$ and the acoustic aperture is 25$\lambda$. To provide asymmetry, input and output transducers are offset by $\lambda/2$ so that the distance between the input transducer to the center transducer is 11$\lambda/2$ and the distance between center transducer and output transducer is 5$\lambda$. The center bi-directional transducer comprises 24 pairs of 5-μm electrodes. The aperture of the center transducer is also 25$\lambda$.

Figure 9:
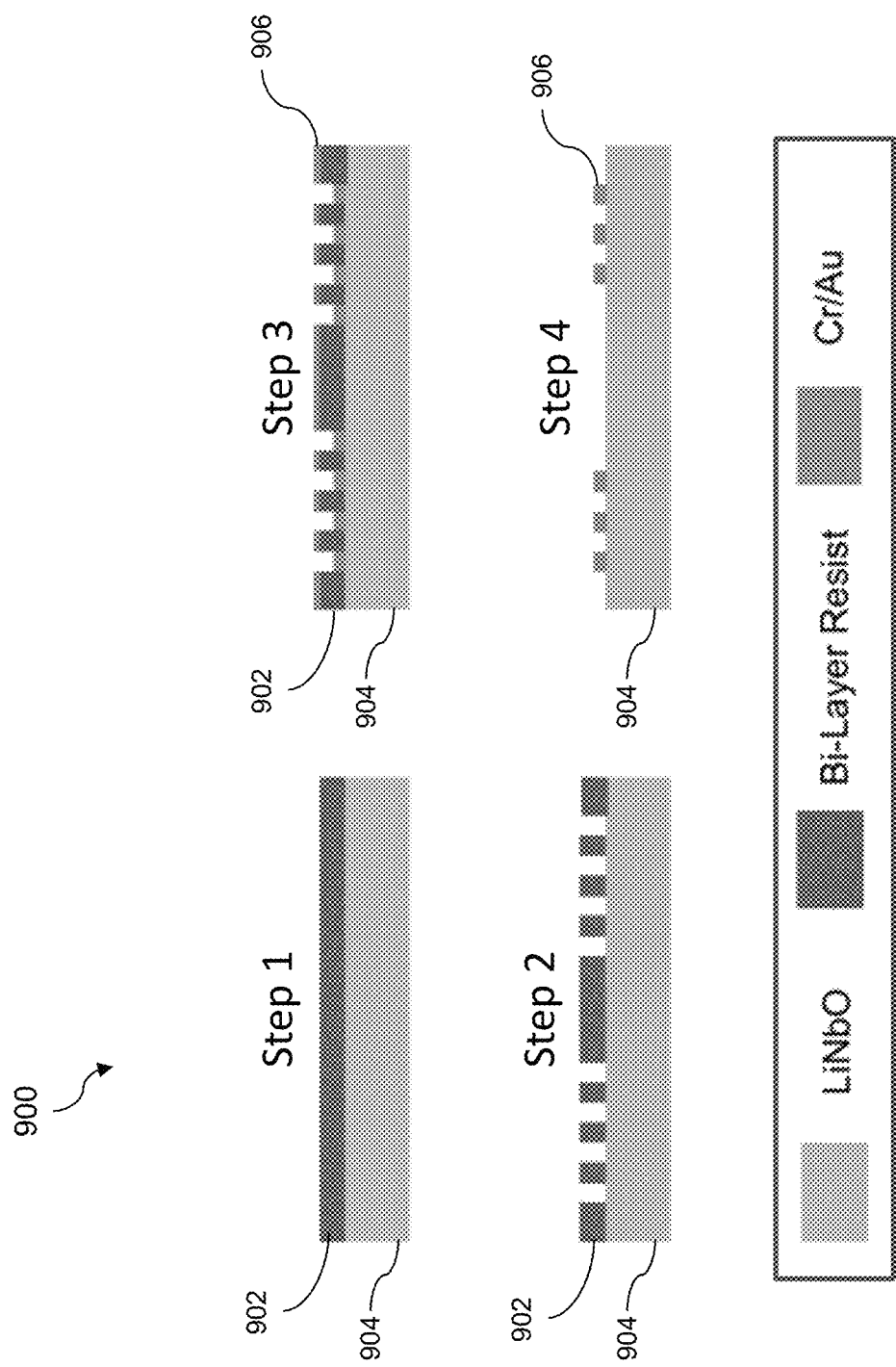
FIG. 9 illustrates fabrication processes for a SAW device, according to some embodiments of the present disclosure.

FIG. 9 illustrates the fabrication process 900 for the SAW device 800 of FIG. 8, according to some embodiments of the present disclosure. In step 1, a bi-layer of resist 902 is spun on a substrate. In some embodiments, a lithium niobate (LiNbO$_3$) substrate 904 may be used, and the bi-layer resist may include LOR3A and S1805. In step 2, the resist is patterned using a laser writer (e.g., by direct write via Heidelberg laser). In step 3, a layer of chrome (e.g., ten nanometer thick) and a layer of gold (e.g., 150 nanometer thick) 906 are deposited onto the patterned resist in an Angstrom E-beam evaporator. In step 4, the device is placed in a solvent to complete the lift-off process of the resist 902, leaving behind the chrome/gold traces 906.

Figure 10:
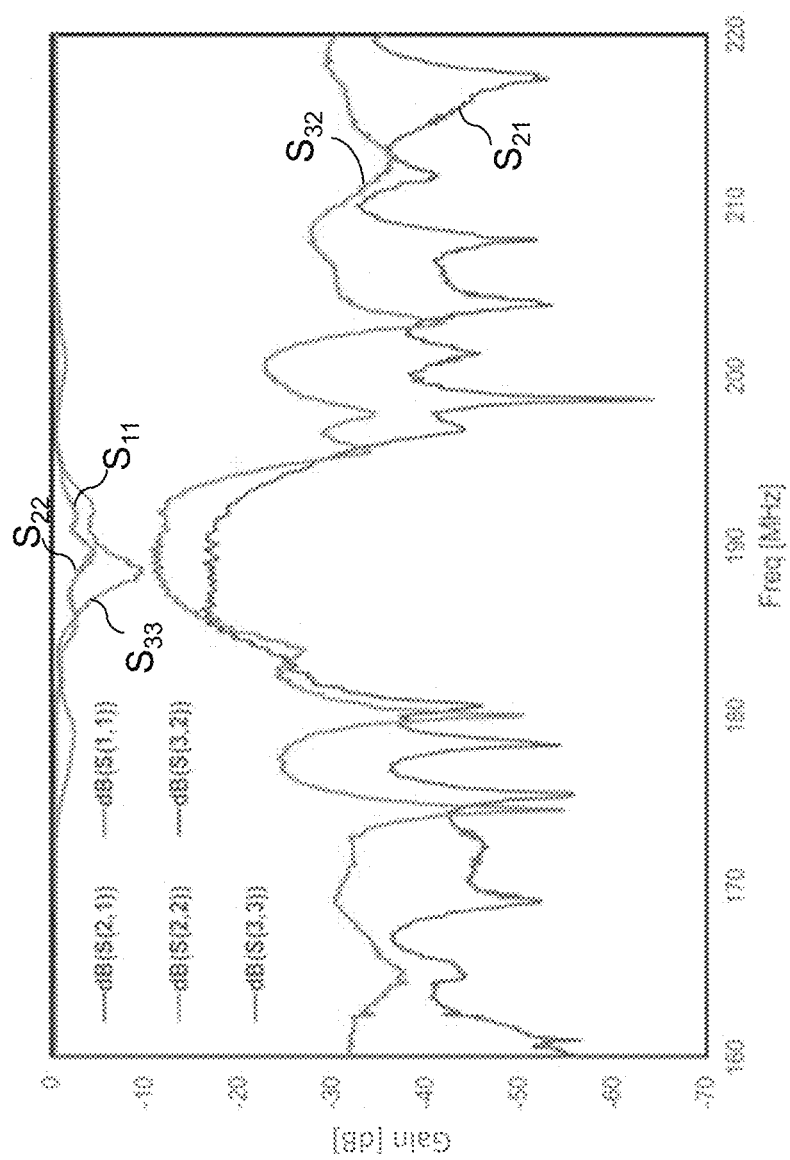
FIG. 10 shows S-parameters of a three-port device measured using a two-port vector network analyzer, according to some embodiments of the present disclosure.

FIG. 10 shows the S-parameters of the three-port device 800 of FIG. 8, measured using a two-port vector network analyzer, with Port 3 of the SAW structure terminated into a 50 ohms load, according to some embodiments of the present disclosure. The port numbers of the S-parameters follow those shown in FIG. 8. The insertion loss between input and output transducers is −16.8 dB, while the insertion loss from center transducer to either input or output transducer is −9.6 dB. The insertion loss may be partly due to the size of the center transducer that is chosen to improve matching to 50 ohms.

Figure 11:
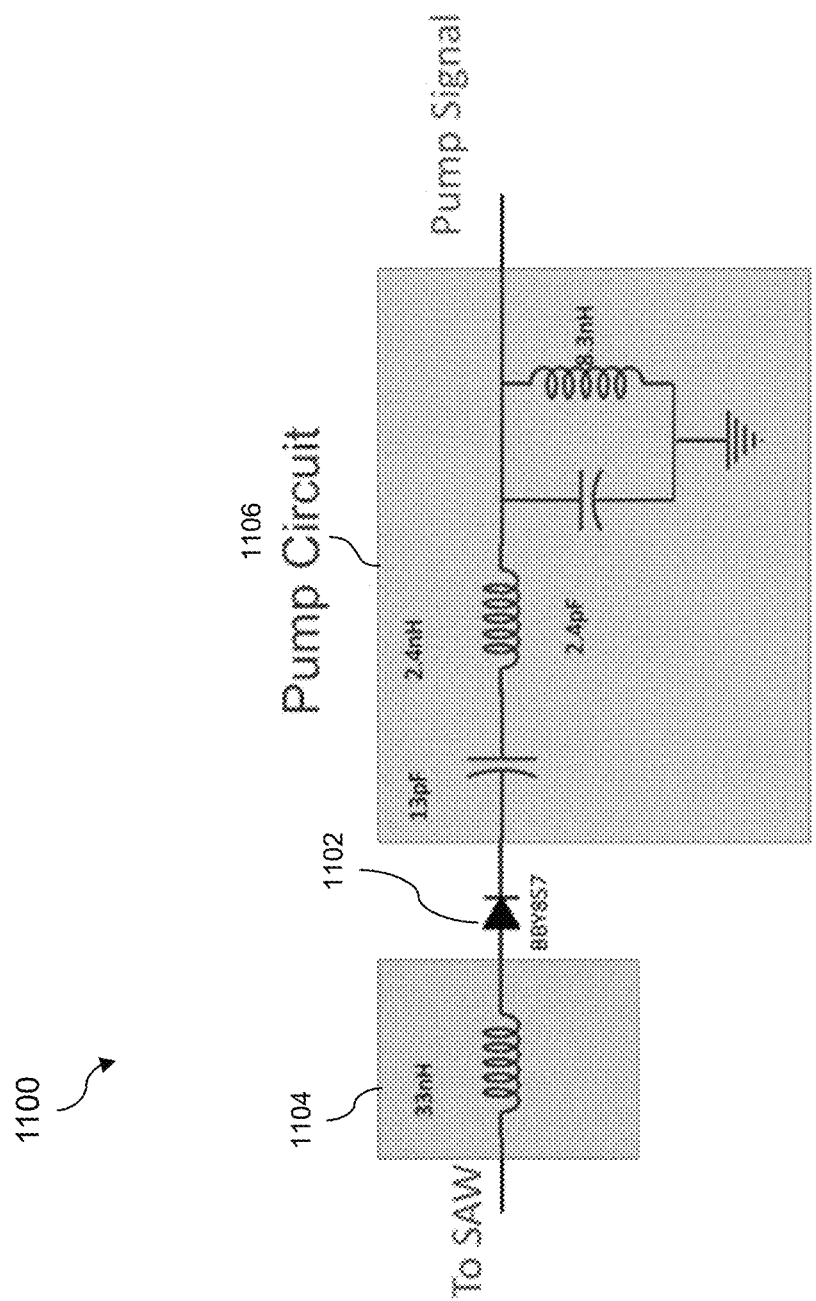
FIG. 11 illustrates a schematic of a parametric amplifier, according to some embodiment of the present disclosure.

FIG. 11 illustrates a schematic of a parametric amplifier 1100, according to some embodiments of the present disclosure. In some embodiments, the current source 106 as shown in FIG. 1A is implemented using the parametric amplifier 1100. The parametric amplifier 1100 may be used to provide a modulation signal at Port 3 of the SAW structure of FIG. 8. Such a parametric amplifier operates by pumping a non-linear reactance, such as a varactor 1102, with a large signal to amplify a small signal at a different frequency. The resulting circuit may provide a reflected version of the input signal with large amounts of electronic gain and a phase according to the pump signal and input signal (i.e., the signal applied at Port 1). The parametric amplifier may be electrically coupled to the center transducer of the SAW structure of FIG. 5 via a coupling inductor 1104. In some embodiments, the value of the coupling inductor 1104 is chosen to resonate the superposition of the capacitance of the center transducer and the average capacitance of varactor 1102 at the center frequency of the SAW. For example, the varactor 1102 may be an INFINEON hyper abrupt diode varactor BBY857. The varactor 1102 may then be matched to the pump circuit 1106 in FIG. 11. The pump circuit 1106 is configured to have a high-pass frequency response which enables the use of many pump frequencies, while also providing some isolation at the frequency of interest.

Figure 12:
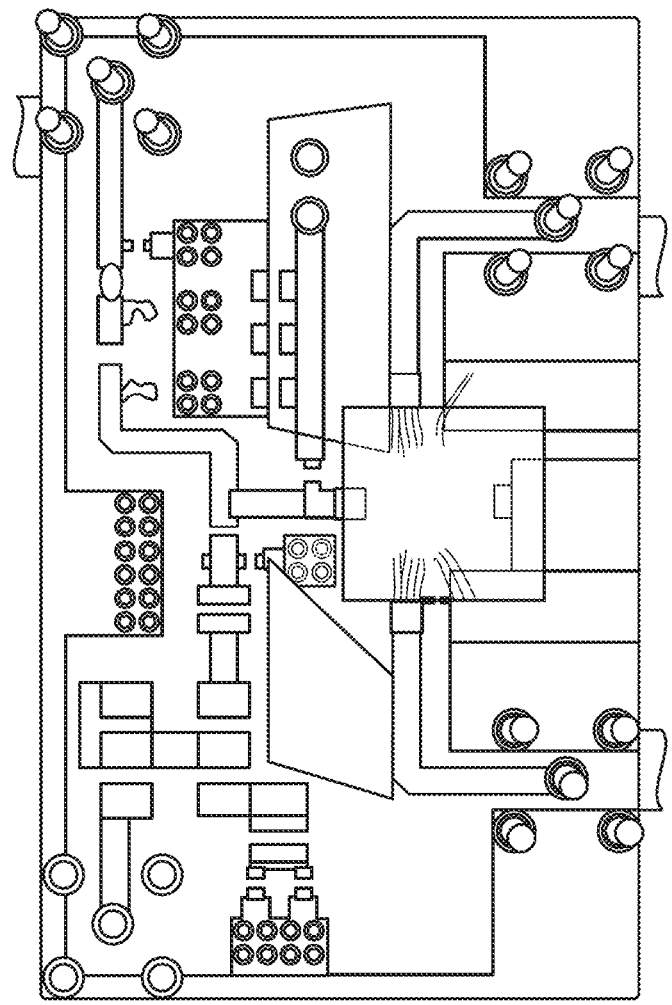
FIG. 12 illustrates a printed circuit board (PCB) including a physical implementation of a parametric amplifier and a SAW structure, according to some embodiments of the present disclosure.

FIG. 12 illustrates a printed circuit board (PCB) 1200 including a physical implementation of the parametric amplifier 1100 of FIG. 11 and the SAW structure 800 of FIG. 8 attached, according to some embodiments of the present disclosure. The SAW structure 800 of FIG. 8 may be attached to the PCB via 2-part epoxy. In some embodiments, electrical connections between the SAW structure and the PCB may be achieved via a gold wire bonding.

Figure 13:
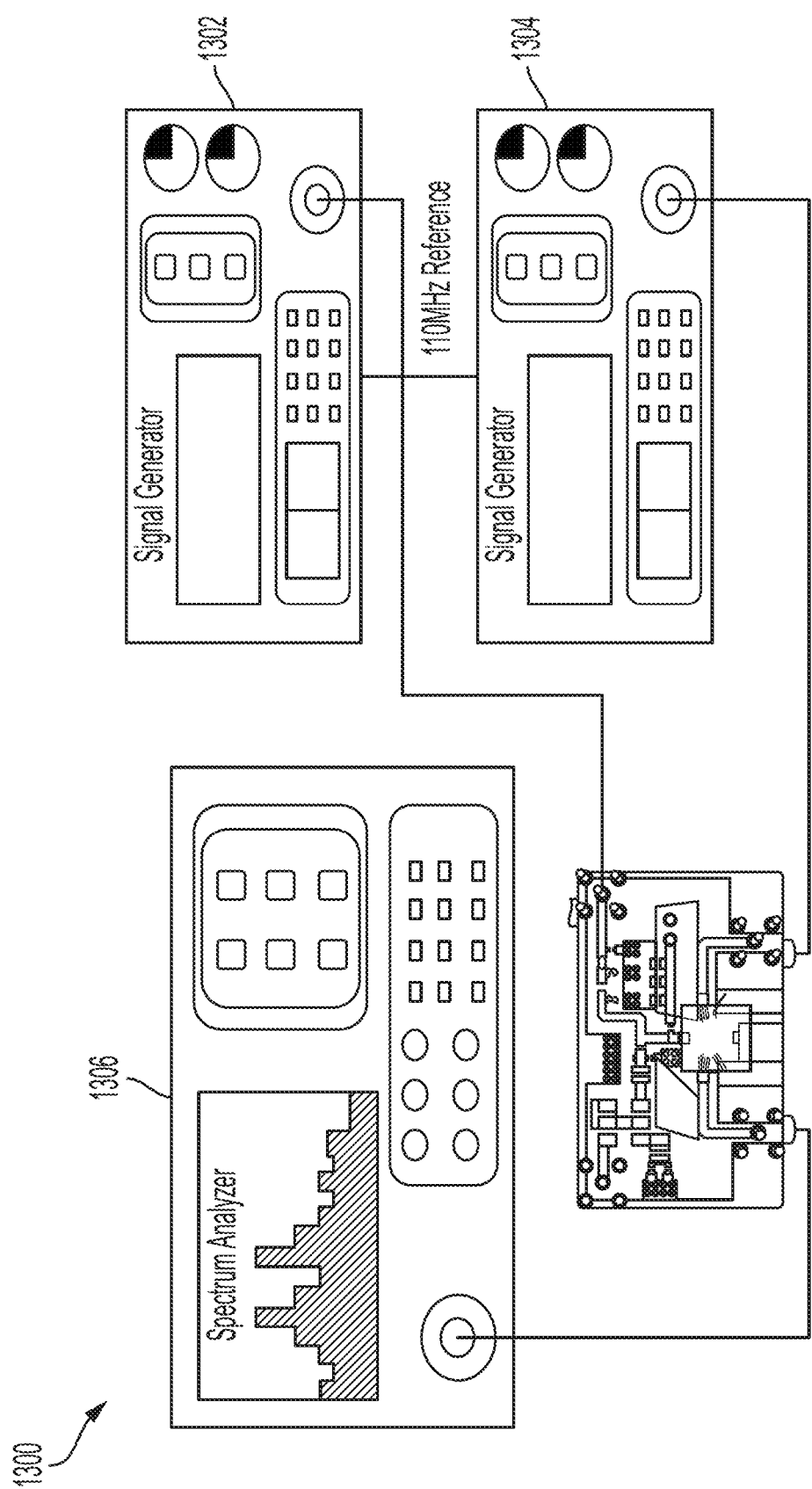
FIG. 13 illustrates a test setup for a parametric amplifier and a SAW structure, according to some embodiments of the present disclosure.

FIG. 13 illustrates a test setup 1300 of the resulting device 1200 of FIG. 12, according to some embodiments of the present disclosure. The resulting device of FIG. 8 may be tested using two signal generators 1302 and 1304 synchronized through their 10-MHz clock reference. One of the generators may provide an input signal to either Port 1 or Port 2, and the other generator provides a pump signal to the pump circuit. The output of the device is connected to a spectrum analyzer 1306 to measure the output power. Since the structure is based on a phase-coherent parametric amplifier of FIG. 11, the frequency $f_P$ of the pump signal can be twice the frequency $f_S$ of the input signal (i.e., $f_P=2f_S$). In some embodiments, this may be achieved by changing the frequency of the signal generators 1302 and 1304 and utilizing a phase adjustment feature in the pump signal generator to ensure that the phase difference between the input signal and pump signal is 0°.

Figure 14B:
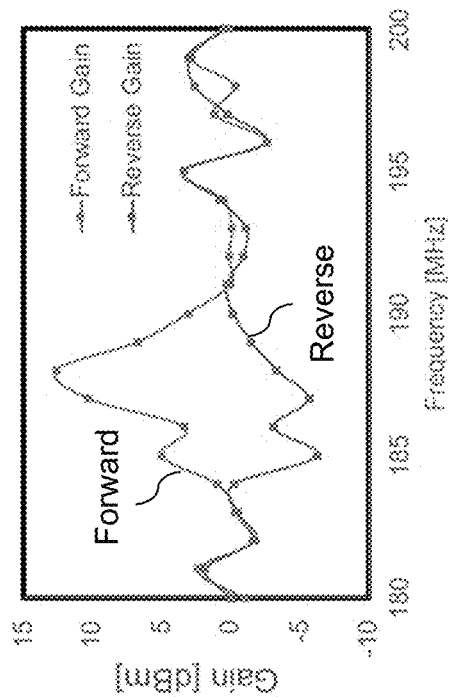
FIGS. 14A and 14B illustrate measured performance of a device when the pump signal is turned off and turned on, according to some embodiments of the present disclosure.
Figure 14A:
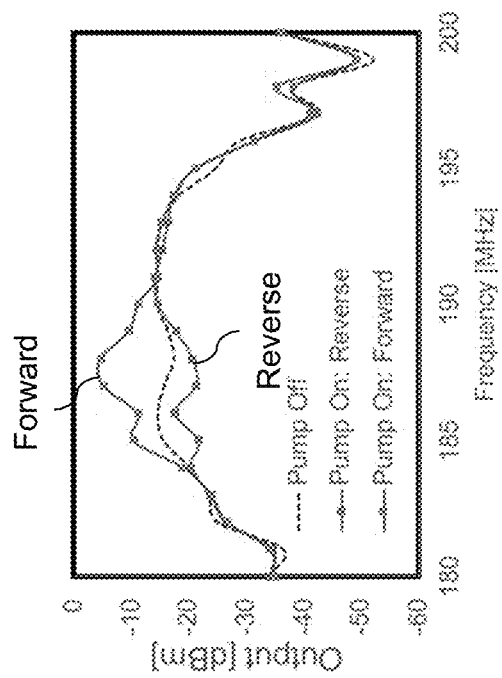

FIGS. 14A and 14B illustrate the measured performance of the device when the pump signal is turned off and turned on, according to an embodiment of the present disclosure. In particular, FIG. 14A illustrates the frequency response of forward and reverse output power of the phase-coherent degenerate mode, and FIG. 14B illustrates the forward and reverse gain of the phase-coherent degenerate mode. In some embodiments, to measure the reverse transmission case, the input and output connections to the SAW structure may simply be switched. The overall device shows an excess of +12 dB of electronic gain in the forward direction improving the insertion loss to −4.67 dB. In the reverse direction, the signal experiences 6.28 dB of attenuation demonstrating the isolator behavior discussed above with a total isolation of 18.3 dB.

Figure 15:
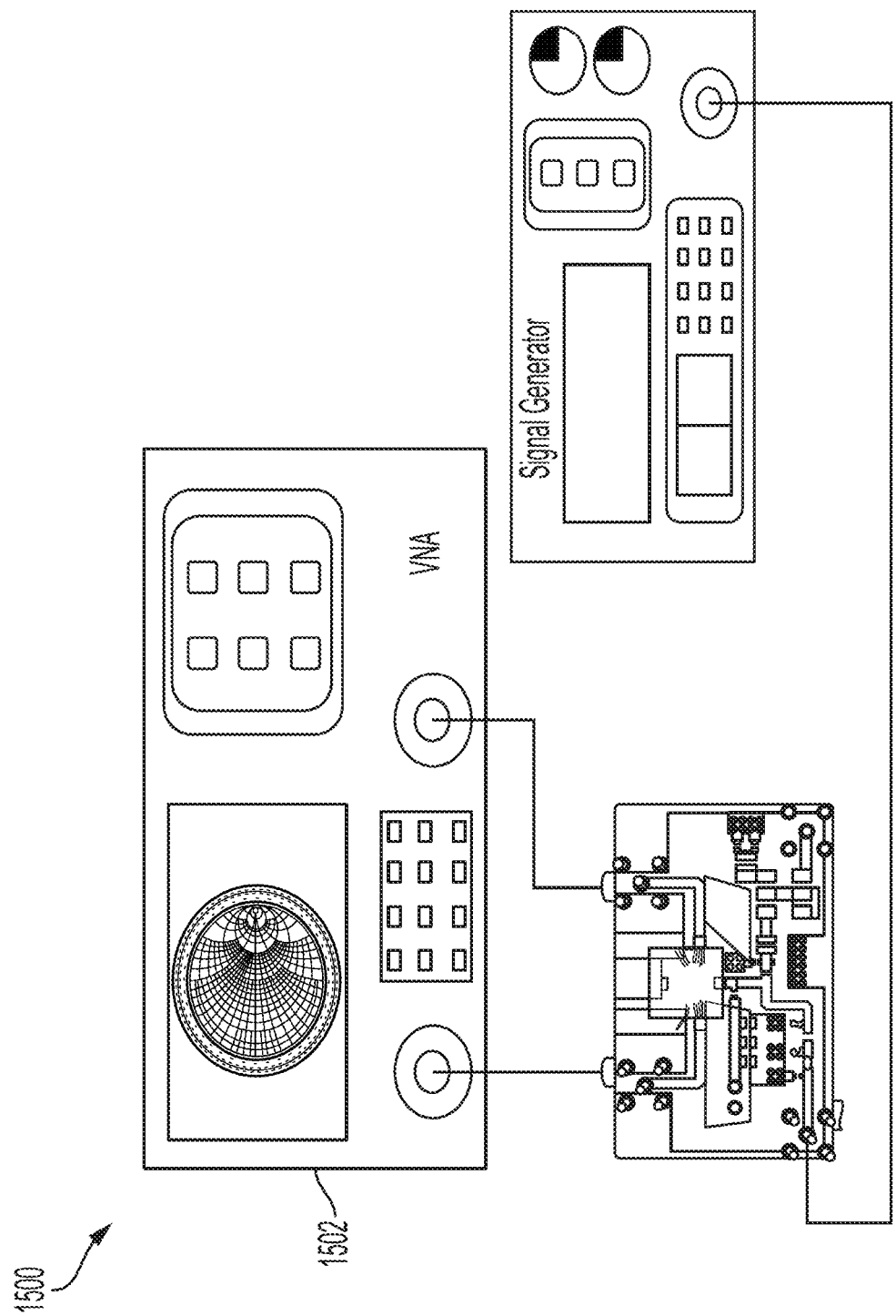
FIG. 15 illustrates a setup to test phase-incoherent degenerate mode, according to some embodiments of the present disclosure.

FIG. 15 illustrates a test setup 1500 to test phase-incoherent degenerate mode, according to some embodiments of the present disclosure. Compared to the setup 1300 in FIG. 13, the signal generator used for the input signal and the spectrum analyzer may be replaced by a two-port vector network analyzer (VNA) 1502. In some embodiments, the pump frequency may be kept constant at 368 MHz. A tuner may be also utilized after the pump signal generator to maximize the interaction.

Figure 16B:
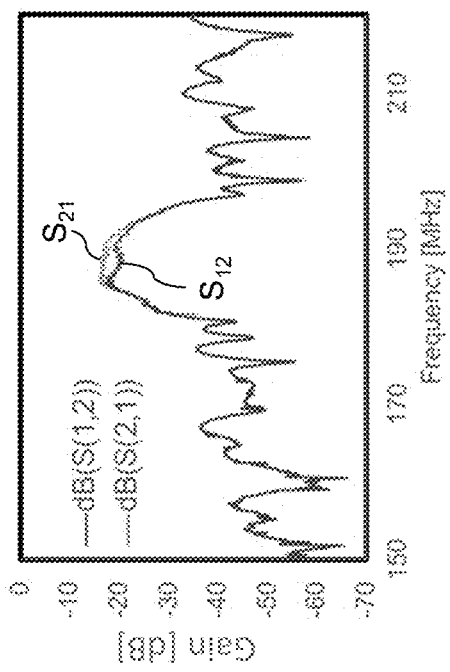
FIGS. 16A and 16B show recorded frequency responses, according to some embodiments of the present disclosure.
Figure 16A:
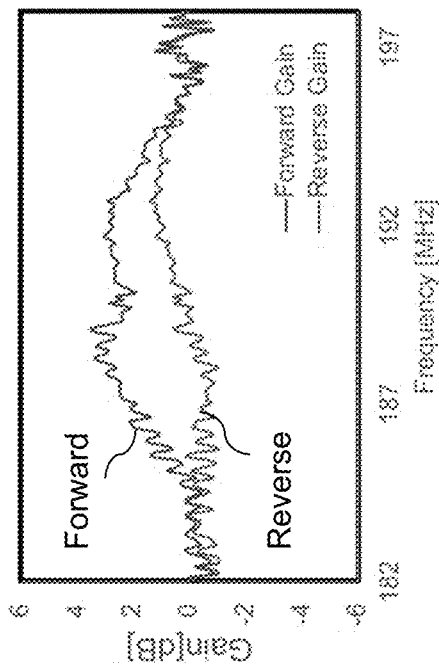

FIGS. 16A and 16B show frequency responses recorded from the test setup 1500 in FIG. 15, according to some embodiments of the present disclosure. FIG. 16A shows the measured forward and reverse S-parameters $S_{21}$ and $S_{12}$, respectively, of the device with a pump power of 21 dBm, while the subscript numbers "1" and "2" refer to Port 1 and Port 2, respectively, as shown in FIG. 8. The resulting forward and reverse gain of the phase-incoherent degenerate mode are shown in FIG. 16B. FIG. 16B shows that the device is capable of +3.3 dB of gain in the forward direction while attenuating the signal in the reverse direction by 1.01 dB. This results in a total isolation of 4.31 dB. Additionally, the tuner may aid in obtaining non-reciprocity over a larger bandwidth than the phase-coherent mode of operation. Without wishing to be bound by theory, this may be due to the single resonant design used to resonate out the capacitance of the transducer and the varactor.

A comparison of the performance of the device 1200 of FIG. 12 to recently published works on non-reciprocal filters is shown in Table I. The works in Pirro and Lu are based on spatio-temporal modulation which utilizes many synchronized clocks. Ghatge utilizes the asymmetrical transduction that occurs due to the nonlinearity of piezoelectric and ferroelectric transducers. See M. Ghatge, G. Walters, T. Nishida and R. Tabrizian, "A Non-Reciprocal Filter Using Asymmetrically Transduced Micro-Acoustic Resonators," in *IEEE Electron Device Letters*, vol. 40, no. 5, pp. 800-803, May 2019. As can be seen in Table I, the device 1200 of FIG. 12 is competitive in insertion loss and isolation making them a viable methods for obtaining non-reciprocal signal transmission and filtering with only one clock or pump source.

TABLE I

| Works | Insertion Loss [dB] | Isolation [dB] | # of Local Oscillators |
| --- | --- | --- | --- |
| Pirro | −5.6 | 15 | 6 |
| Lu | −6.6 | 25.4 | 4 |
| Ghatge | −60 | 16 | 0 |
| FIG. 12 device | −14.2 to −4.67 | 5.2 to 18.3 | 1 |

Figure 17:
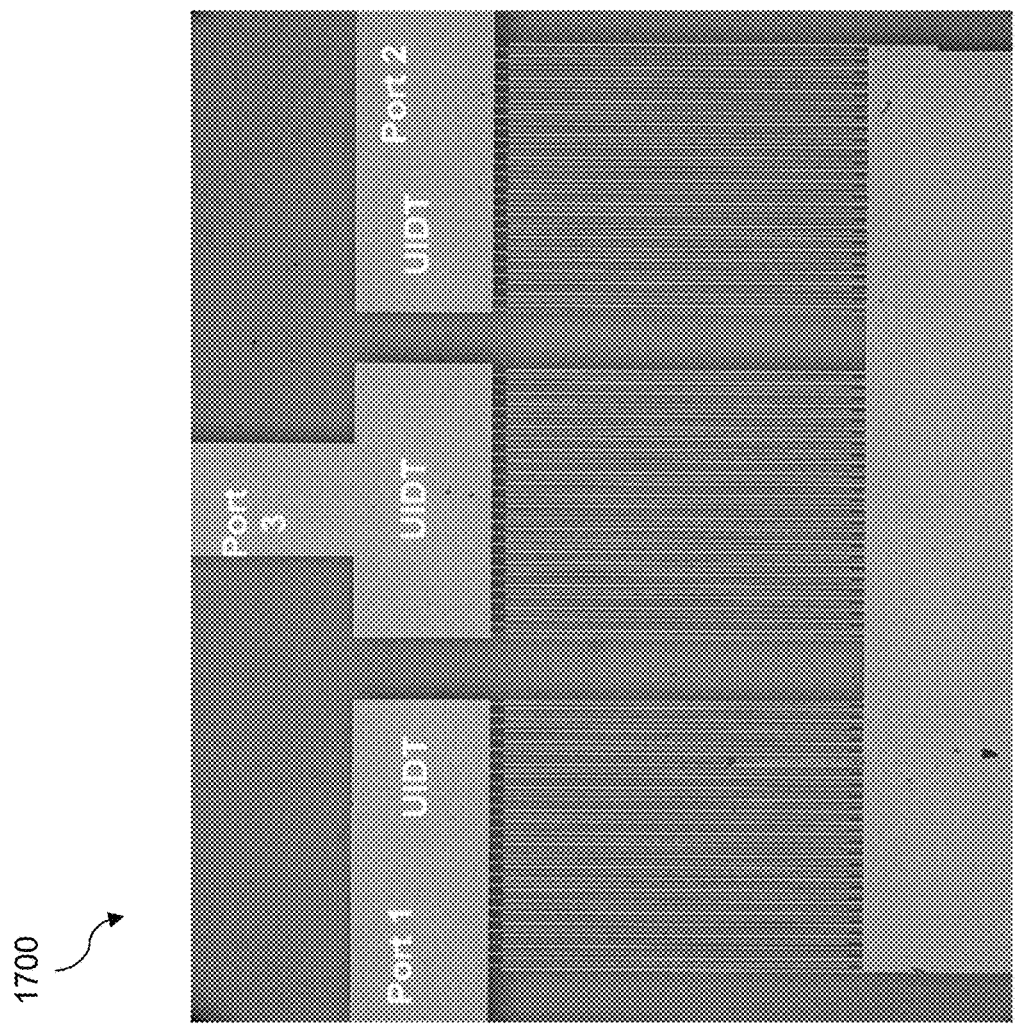
FIG. 17 shows a micrograph of an implementation of a non-reciprocal filter in the acoustics domain as an SAW structure, according to some embodiments of the present disclosure.

FIG. 17 illustrates a micrograph of an exemplary implementation 1700 of the filter 100 of FIG. 1 in the acoustics domain as a SAW structure, according to some embodiments of the present disclosure. Unlike to the SAW structure 800 of FIG. 8 in which the center transducer is a bi-directional interdigital transducer (IDT), the center transducer in the structure 1700 is unidirectional and it actuates and absorbs acoustic waves asymmetrically. Therefore, directionality can be introduced to the center transducer.

Figure 18:
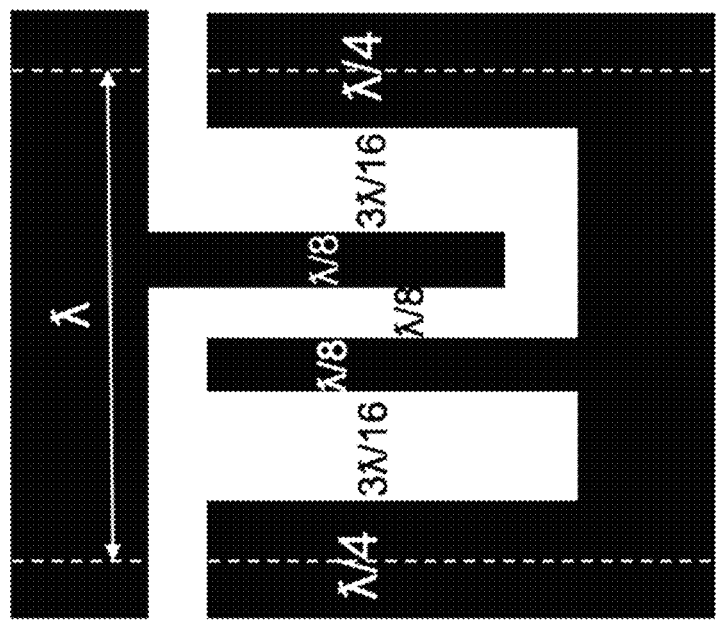
FIG. 18 illustrates a close-up schematic of digits of an input, output, and center transducers of an SAW structure, according to some embodiments of the present disclosure.

FIG. 18 illustrates a close-up schematic of exemplary digits of the input, output, and center transducers of the SAW structure 1700 of FIG. 17, according to some embodiments of the present disclosure.

Figure 19:
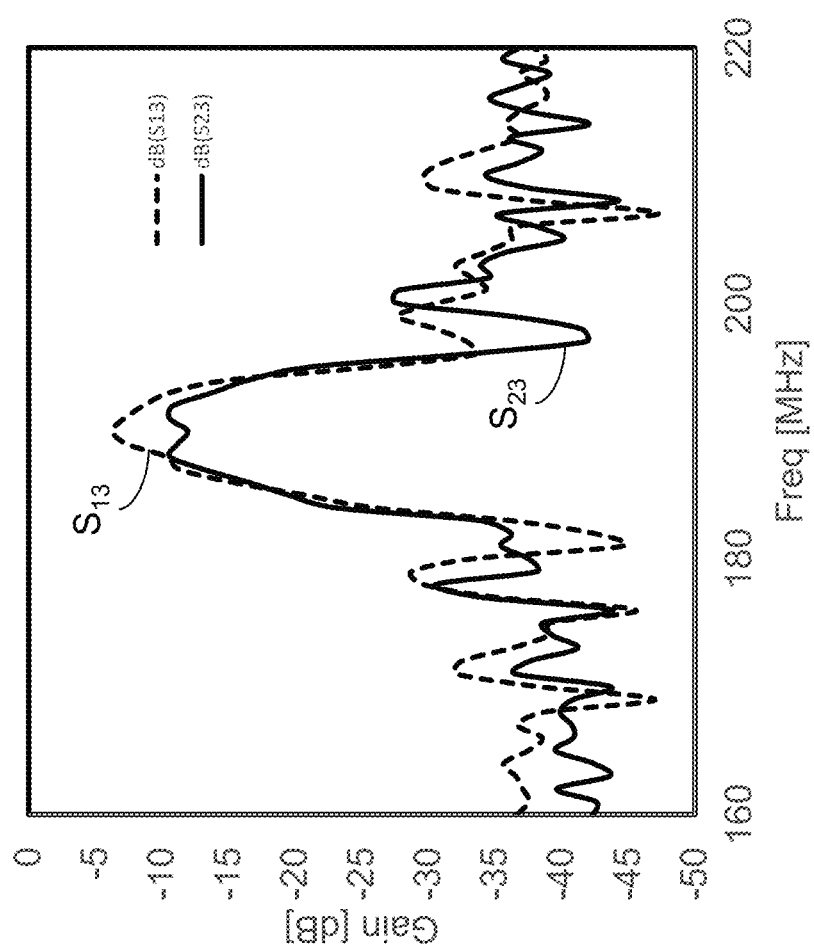
FIG. 19 shows frequency responses of an SAW structure, according to some embodiments of the present disclosure.

FIG. 19 shows the frequency response of the SAW structure 1700 of FIG. 17, according to some embodiments of the present disclosure. The S-parameter $S_{13}$ corresponds to the response at Port 1 due to an input signal at Port 3, and the S-parameter $S_{23}$ corresponds to the response at Port 2 due to an input signal at Port 3.

Figure 20:
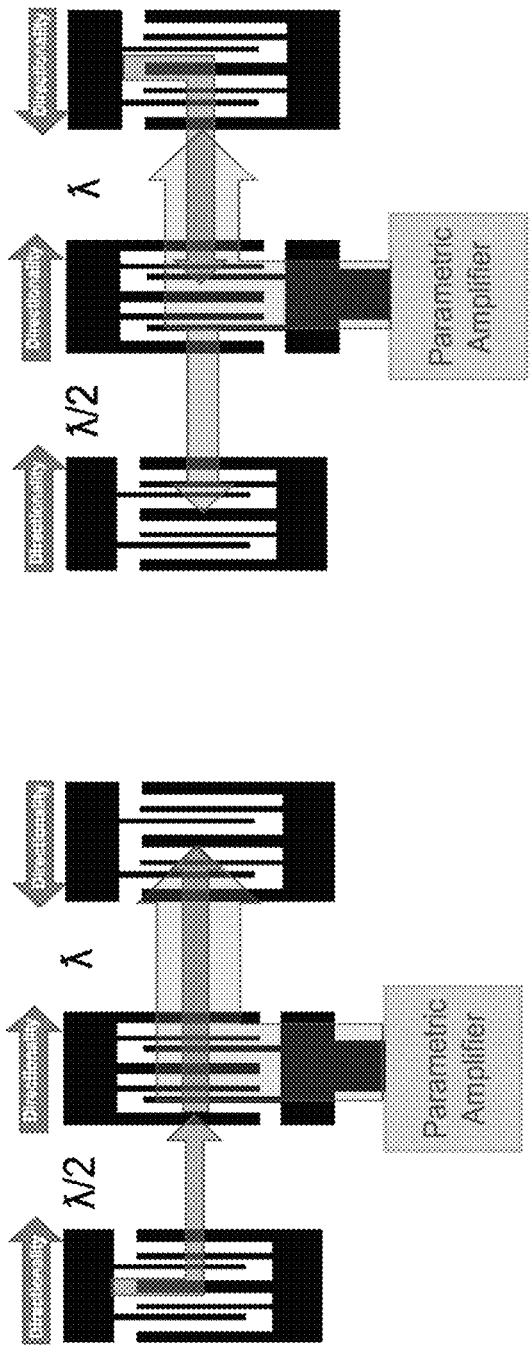
FIG. 20 shows schematics illustrating how the uni-directional center transducer leads to general non-reciprocal behavior in an SAW structure, according to some embodiments of the present disclosure.

FIG. 20 shows how the uni-directional center transducer leads to general non-reciprocal behavior in the SAW structure 1700 of FIG. 17, according to some embodiments of the present disclosure. In the forward case, a signal applied at the input port, which is absorbed by the center transducer, amplifies and constructively interferes at the output transducer. In the reverse case, a signal applied at the output port gets reflected back to the output port and destructively interferes with unabsorbed signal at the output port.

Figure 21:
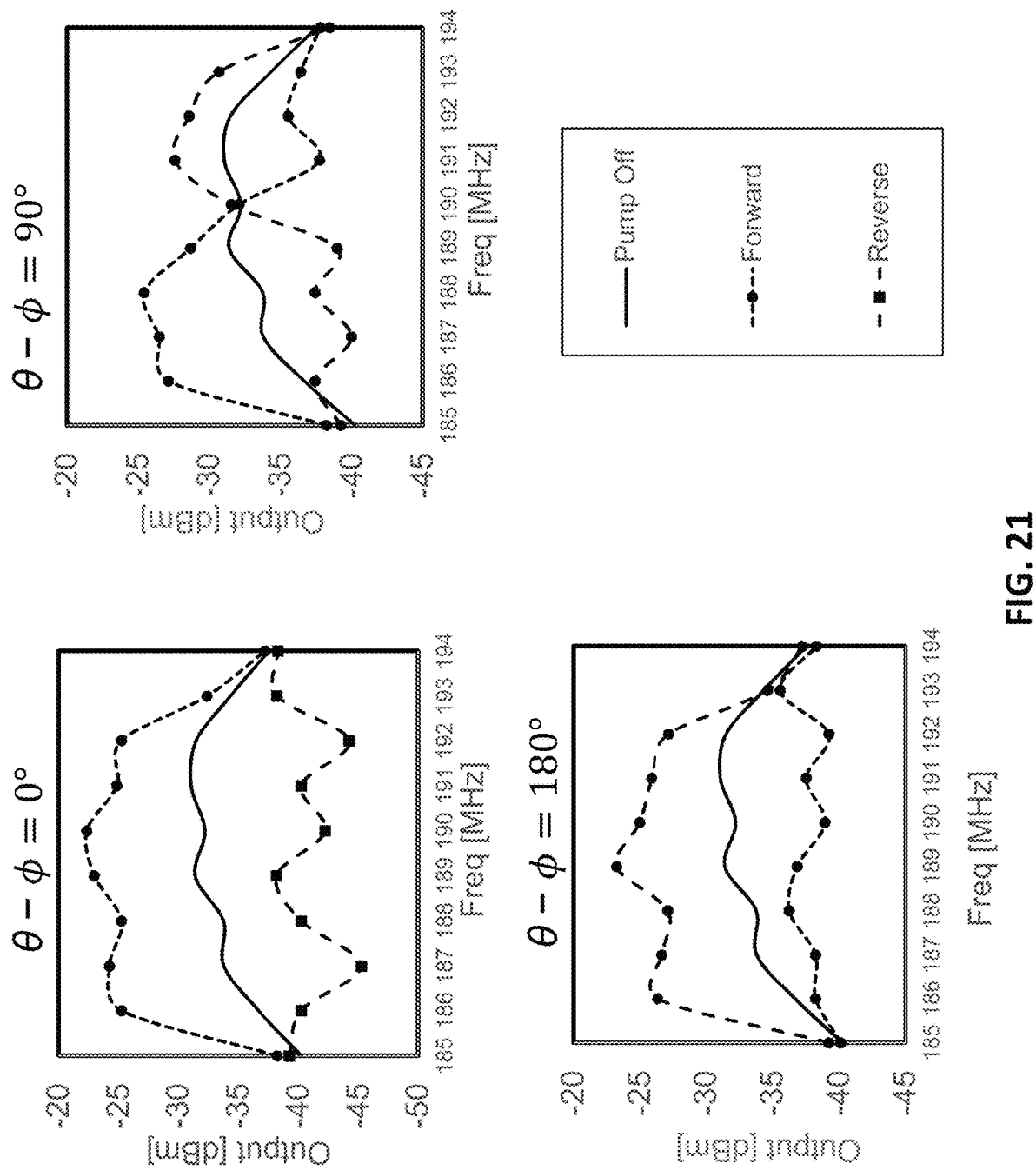
FIG. 21 illustrates frequency responses of an SAW structure, according to some embodiments of the present disclosure.

FIG. 21 illustrates frequency responses of the SAW structure 1700 of FIG. 17, according to some embodiments of the present disclosure. In particular, FIG. 21 shows responses and tunable aspects of the SAW structure 1700 when it is operated under the phase-coherent mode, where the pump frequency is twice the signal frequency. The SAW structure 1700 of FIG. 17 shows significant improvement of the SAW structure 800 of FIG. 8.

Figure 22:
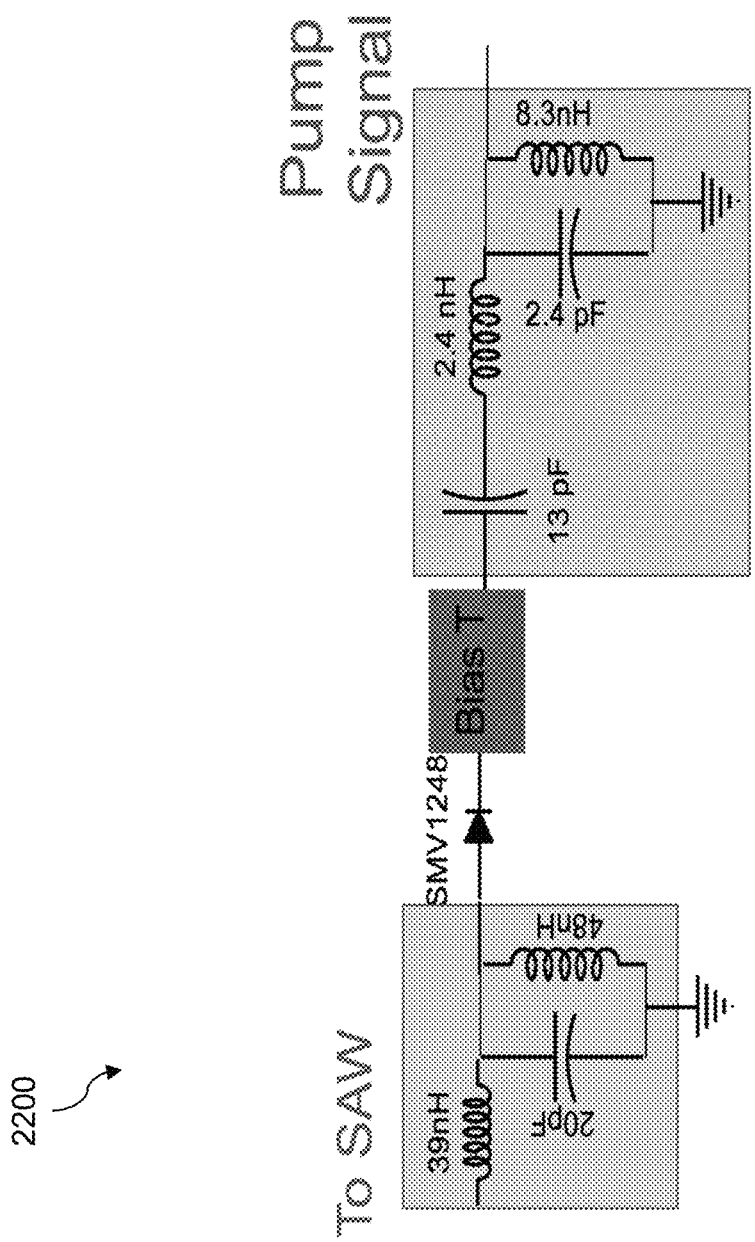
FIG. 22 is a schematic of a parametric amplifier used to operate an SAW structure in phase-incoherent mode, according to some embodiments of the present disclosure.

FIG. 22 is a schematic of a parametric amplifier 2200 used to operate the SAW structure 1700 of FIG. 17 in phase-incoherent mode (i.e., $f_p \neq 2f_s$), according to some embodiments of the present disclosure.

Figure 23:
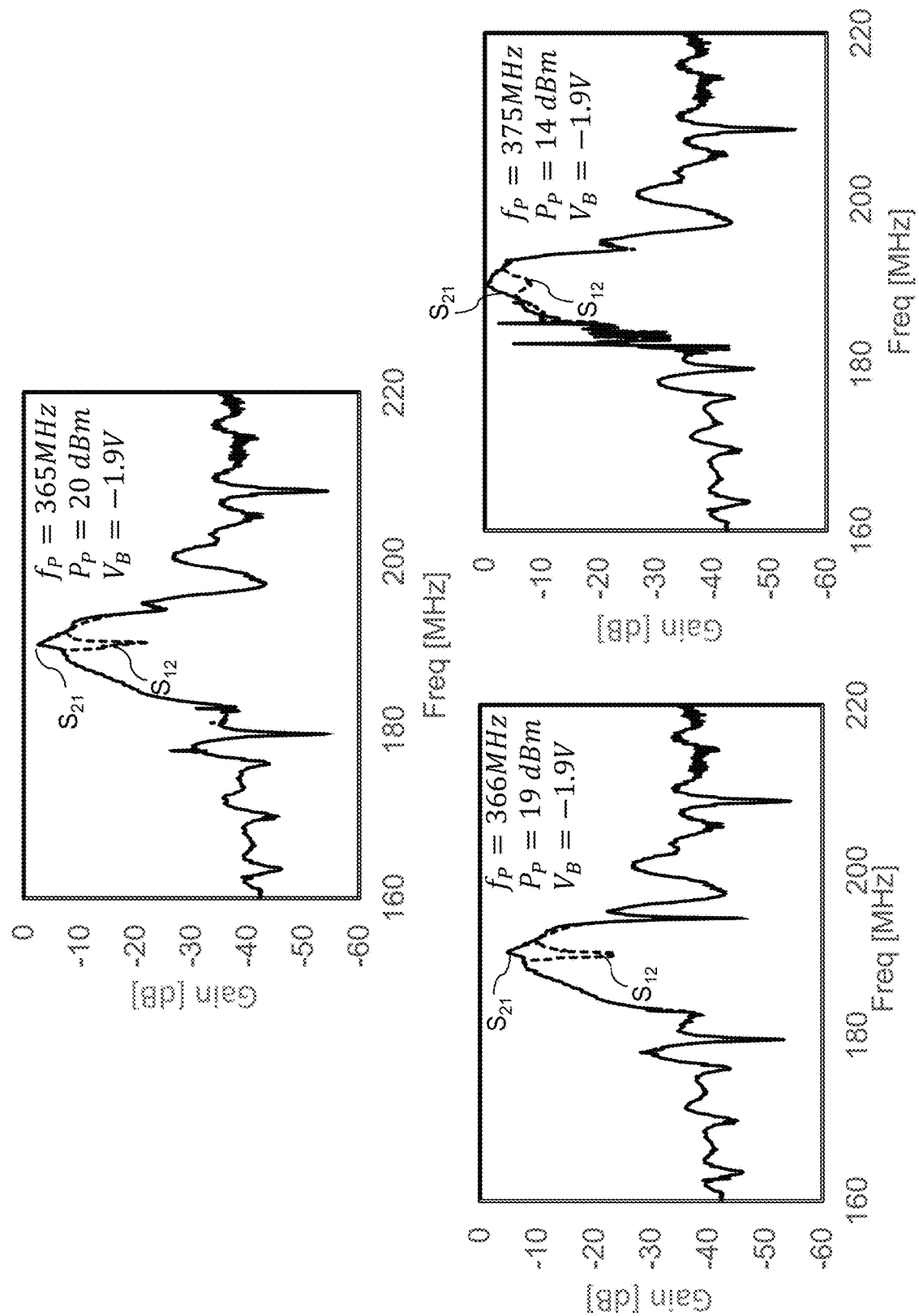
FIG. 23 illustrates frequency responses of an SAW structure operating in phase-incoherent mode, according to some embodiments of the present disclosure.

FIG. 23 illustrates frequency responses of the SAW structure 1700 of FIG. 17 operating in phase-incoherent mode, according to some embodiments of the present disclosure. As can be seen, both gain and isolation may be obtained under different pump conditions.

Figure 24:
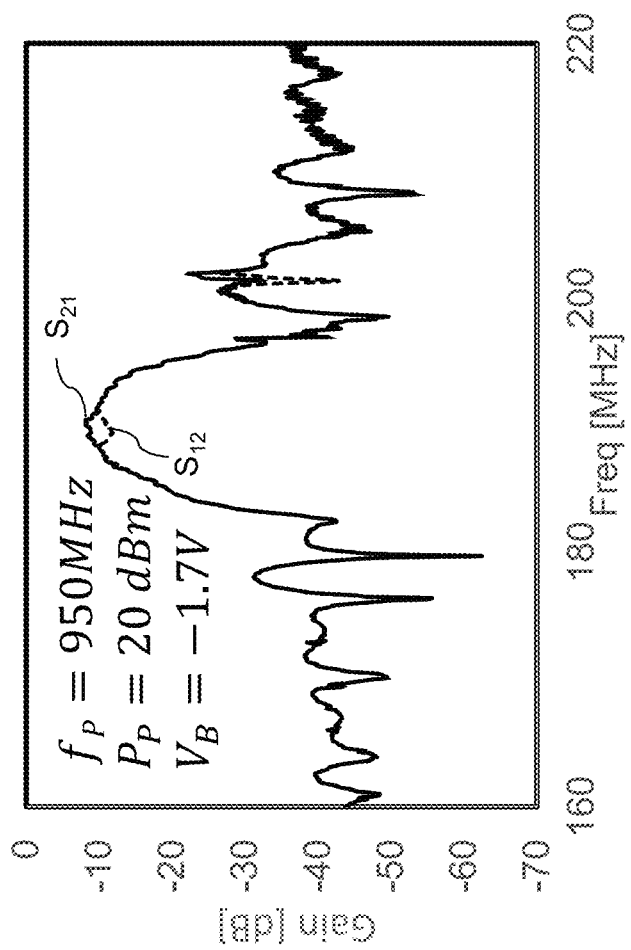
FIG. 24 illustrates the frequency response of an SAW structure operating in non-degenerate mode, according to some embodiments of the present disclosure.

FIG. 24 illustrates the frequency response of the SAW structure 1700 of FIG. 17 operating in non-degenerate mode, according to some embodiments of the present disclosure. In a non-degenerate mode, the frequency of the pump signal is much higher than the signal applied at the input port of the SAW structure. Operating in a non-degenerate mode may provide noise and output power advantages compared to other modes.

Figure 25:
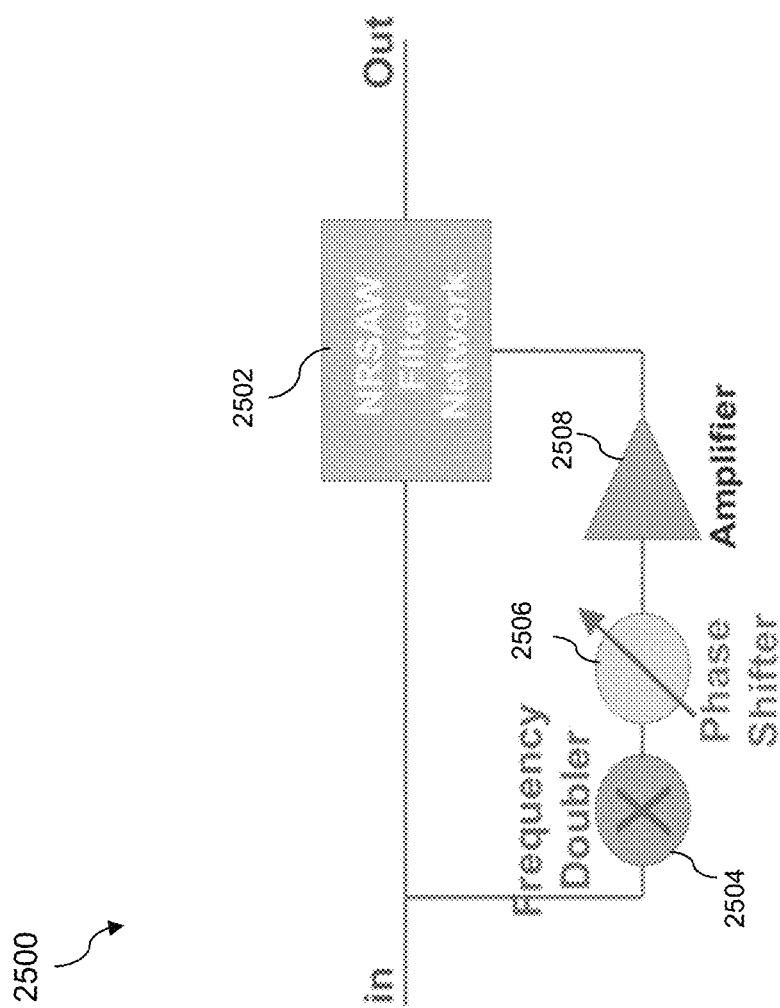
FIG. 25 illustrates an application of a non-reciprocal filter, according to some embodiments of the present disclosure.

FIG. 25 illustrates an application 2500 of the filter described herein, according to some embodiment of the present disclosure. A non-reciprocal SAW filter network 2502 can be combined with a frequency doubler 2504, a phase shifter 2506, and an amplifier 2508 into a signal processing circuitry.

Figure 26:
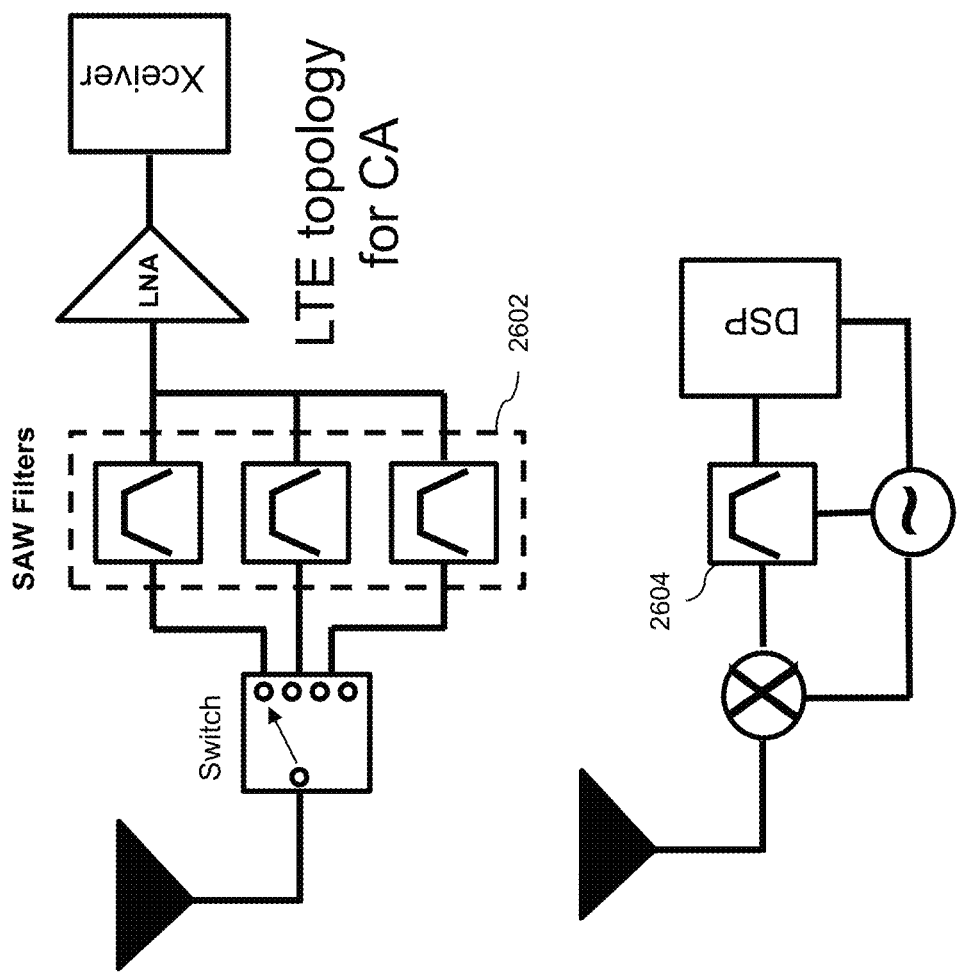
FIG. 26 illustrates a non-reciprocal filter applied in carrier aggregation (CA), according to some embodiments of the present disclosure.

FIG. 26 illustrates how the filter described herein may be applied in carrier aggregation (CA), according to some embodiments of the present disclosure. The phase-coherent version of the filter, for example, may provide relief to CA topologies commonly used in 4G LTE mobile devices. Up to 30 filters are typically used to accommodate CA to maximize user data rates in multiple user environment. This requires many filters (shown as 2602) at different center frequency without overlapping. A tunable filter 2604 with a center frequency tunability of 5% may replace many of these filters and free up valuable space in mobile devices. The filter disclosed herein provides tunability with added gain, isolation, and minimized losses, which may greatly improve the overall performance of the system. This same tunability may also be used to implement a programmable antenna interface where duplex and full duplex modes may be achieved.

Figure 27:
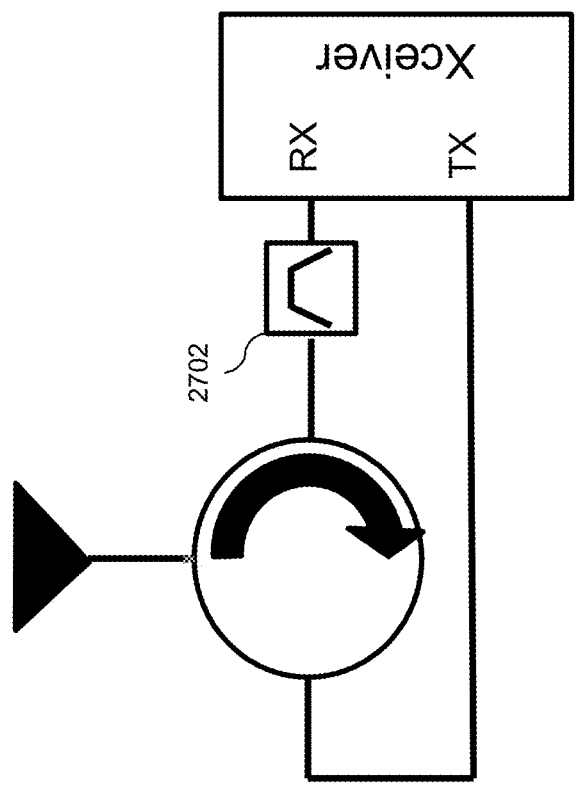
FIG. 27 illustrates a non-reciprocal filter applied in a full-duplex system as a non-reciprocal frontend filter, according to some embodiments of the present disclosure.

FIG. 27 illustrates how the filter described herein may be applied in a full-duplex system as a non-reciprocal frontend filter, according to some embodiments of the present disclosure. Since full-duplex systems depend greatly on isolation that can be produced between transmitted and received signals through the circulator or other means, a non-reciprocal filter 2702 as shown in FIG. 27 may provide added isolation and immunity of the circulator to mismatch losses.

While the invention has been particularly shown and described with reference to specific preferred embodiments, it should be understood by those skilled in the art that various changes in form and detail may be made therein without departing from the spirit and scope of the invention as defined by the appended claims.

The invention claimed is:

1. A filter comprising:
a first port and a second port, wherein an input signal propagates from the first port to the second port;
a third port different from the first and second ports;
a first transmission line connected to the first port and the third port;
a second transmission line connected to the second port and the third port; and
a current source connected to the third port, wherein the current source provides a modulation signal to the third port,
wherein the length of the first transmission line is different from the length of the second transmission line, and
the first and second transmission lines each comprises at least one capacitor and at least one inductor.

2. The filter of claim 1, wherein the length of the first transmission line is offset by $\lambda/2$ from the length of the second transmission line is $\lambda$, wherein $\lambda$, represents an angular wavelength of the input signal propagating from the first port to the second port.

3. The filter of claim 1, wherein the phase of the current source matches the phase of the input signal.

4. The filter of claim 1, wherein the phase of the current source is different from the phase of the input signal.

5. The filter of claim 1, wherein the current source comprises a parametric amplifier.

6. The filter of claim 5, wherein the parametric amplifier comprises a pump circuit and a varactor.

7. The filter of claim 6, wherein the varactor comprises an abrupt varactor diode.

8. The filter of claim 1, wherein the filter provides a positive forward gain.

9. The filter of claim 1, wherein the filter provides a negative reverse gain.

10. The filter of claim 1, wherein the filter comprises a surface acoustic wave (SAW) structure, and wherein the SAW structure comprises an input transducer, an output transducer, and a center transducer.

11. The filter of claim 10, wherein the input and output transducers each comprises a single-phase uni-directional interdigital transducer.

12. The filter of claim 10, wherein the center transducer comprises a bi-directional interdigital transducer.

13. The filter of claim 10, wherein the center transducer comprises a unidirectional interdigital transducer.

14. The filter of claim 10, wherein the distance between the input transducer and the center transducer is offset by $\lambda/2$ from the distance between the center transducer and the output transducer.

15. The filter of claim 10, wherein the SAW structure comprises a lithium niobate ($LiNbO_3$) substrate.

16. The filter of claim 10, wherein the SAW structure comprises chrome and gold.

* * * * *